United States Patent [19]

Iwata et al.

[11] Patent Number: 5,637,895

[45] Date of Patent: Jun. 10, 1997

[54] NON-VOLATILE SEMICONDUCTOR MEMORY DEVICE

[75] Inventors: Yoshihisa Iwata, Yokohama; Hiroshi Nakamura, Kawasaki, both of Japan

[73] Assignee: Kabushiki Kaisha Toshiba, Tokyo, Japan

[21] Appl. No.: 523,315

[22] Filed: Sep. 5, 1995

[51] Int. Cl.$^6$ .................. H01L 29/792; H01L 29/788
[52] U.S. Cl. .................. 257/315; 257/390; 365/185.05
[58] Field of Search .................. 257/315, 316, 257/321, 390; 365/185.05, 185.06, 185.26, 185.01

[56] References Cited

U.S. PATENT DOCUMENTS

| | | | |
|---|---|---|---|
| 5,290,723 | 3/1994 | Tami et al. | 437/43 |
| 5,293,337 | 3/1994 | Artome et al. | 365/185 |
| 5,471,423 | 11/1995 | Iwasa | 365/185.01 |
| 5,497,018 | 3/1996 | Kajita | 257/316 |

*Primary Examiner*—Donald L. Monin, Jr.
*Attorney, Agent, or Firm*—Loeb & Loeb LLP

[57] ABSTRACT

In a non-volatile semiconductor memory device having a memory cell array formed by arranging a plurality of non-volatile reloadable semiconductor memory cells (Mi) and select gate elements on a semiconductor substrate (11) via a gate insulating film (13), each memory cell being formed by interposing an interlayer insulating film (15) between a charge storage layer and a control gate line ($16_i$), the memory device comprises a plurality of select gate lines ($14_i$) formed by a wiring layer the same as the charge storage layer of the memory cells, as gate electrodes of the select gate elements; and select gate over-adjacent connect lines ($16_9$, $16_{10}$) formed by a wiring layer the same as the control gate lines ($16_i$) of the memory cells and located over the select gate lines ($14_9$, $14_{10}$) via an insulating film in such a way as to be kept floated without contacting with any other wires and potential nodes.

33 Claims, 32 Drawing Sheets

NON-VOLATILE SEMICONDUCTOR MEMORY DEVICE

FIELD OF THE INVENTION

The present invention relates to an electrically erasable and programmable non-volatile semiconductor memory device (EEPROM), and more specifically to an EEPROM having a memory cell array composed of NAND cells.

BACKGROUND OF THE INVENTION

As the electrically re-writable (reloadable) non-volatile memory, an highly-integral NAND-cell type EEPROM has been so far well known, in which a memory cell array is composed of a plurality of series-connected writable/erasable cells, and a select gate is connected between an end of each memory cell column and a source line and further between the other end of the memory cell column and a bit line contact, respectively. FIG. 22(a) is a plane view and FIG. 22(b) is an equivalent circuit diagram both showing only one NAND cell section of the memory cell array of the conventional NAND cell type EEPROM. Further, FIG. 23 is a longitudinal cross-sectional view showing the NAND cell section, taken along the line L–L' in FIG. 22(a); and FIGS. 24(a) and 24(b) are both lateral cross-sectional views taken along the lines M–M' and N–N' shown in FIG. 22(a). Further, FIG. 25 is a plane view showing an arrangement of a plurality of NAND cells in the conventional memory cell array; FIG. 26(a) is a plane view showing a select gate contact region (V) or (VI) both shown in FIG. 25 of the conventional NAND cell type EEPROM; FIG. 26(b) is a cross-sectional view taken along the line O–O' shown in FIG. 26; and FIG. 27 is an enlarged perspective view showing an essential portion shown in FIG. 26(b).

With reference to these drawings, the conventional technique of the EEPROM will be explained hereinbelow. Further, in FIGS. 22(a) and 22(b) and FIG. 23, the reference numeral 19 denotes a diffusion layer; $14_1$ to $14_8$ denote floating gates; $14_9$ and $14_{10}$ denote select gate lines; $16_1$ to $16_8$ ($CG_1$ to $CG_8$) denote control gate lines; $16_9$ and $16_{10}$ denote select gate over-adjacent wires (a wire adjacent to the upper side of the select gate lines $14_9$ and $14_{10}$, respectively); 18 (DL) denotes a bit line; $S_1$ and $S_2$ denote select transistors; and $M_1$ to $M_8$ denotes memory cells. Further, in FIG. 23, the reference numeral 11 denotes a semiconductor substrate; 13 denotes a gate oxide film; and 15 and 17 denote interlayer insulating films. Further, in FIG. 24, the reference numeral 12 denotes a field oxide film. Further in these respective drawings, the same reference numerals indicate the same composing elements. In particular, as understood in FIG. 23, the select gate lines $14_9$ and $14_{10}$ and the floating gates $14_1$ to $14_8$ are formed as relatively high resistances through the same process and of the same material. The reason is as follows: in the case where the floating gates are formed of n-type poly silicon, for instance, if the concentration of the n-type dopant (e.g., phosphorus) is high, the reliability of the gate oxide film 13 may deteriorate. Further, the select gate over-adjacent wires $16_9$ and $16_{10}$, and the control gates $16_1$ to $16_8$ are formed through the same process and of the same material as relatively low resistances, as compared with those of the select gate lines $14_9$ and $14_{10}$ and the floating gates $14_1$ to $14_8$.

As described above, as the material of the select gate lines $14_9$ and $14_{10}$ (shown in FIG. 23), a wire material of relatively high resistance is used. Consequently, the resistances of the select gate lines $14_9$ and $14_{10}$ are high, so that the times required to charge and discharge to and from the select gate lines $14_9$ and $14_{10}$ are relatively long. Further, in FIG. 22(b), the gate electrodes for driving the element (select gates) $S_1$ and $S_2$ are node (select gate lines) $14_9$ and $14_{10}$ (shown in FIG. 23). Accordingly, since the necessary charge/discharge times to and from the select gate lines $14_9$ and $14_{10}$ are long, there arises a problem in that the necessary operation time including the charge/discharge to and from the select gate lines is lengthened. To shorten the necessary operation time, conventionally, the method of reducing the effective resistances of the select gate lines in the memory cell array has been so far adopted. To realize this method, the select gate contact regions (V) and (VI) as shown in FIG. 25 are used.

In the conventional method shown in FIG. 26, in the select gate contact regions (V) and (VI) shown in FIG. 25, the node $14_9$ or $14_{10}$ is connected to the select gate over-adjacent wire $16_9$ or $16_{10}$, respectively through the two wire layers 18a and 18b formed of the material the same as that of the bit line 18. FIG. 26(b) is a cross-sectional view taken along the line O–O' in FIG. 26(a), and FIG. 27 is a perspective view showing the essential portion thereof. When the conventional method as explained with reference to FIGS. 26 and 27 are used, it is possible to connect the select gate over-adjacent wire $16_9$ or $16_{10}$ formed of a wiring material lower in resistance than that of the select gate line $14_9$ or $14_{10}$ to the select gate line $14_9$ or $14_{10}$ in the memory cell, with the result that the effective resistance of the select gate line can be reduced. On the other hand, the select gate contact regions (V) and (VI) shown in FIG. 25 are provided at intervals of the bit lines of several tens to several hundreds in the memory cell array. In other words, the select gate lines are formed at many positions of several tens or several hundreds. In this case, the necessary charge/discharge time to and from the select gate lines $14_9$ and $14_{10}$ is mainly determined by the charge/discharge time to and from the wiring portions on the high resistance side, in other words, by the charge/discharge time to and from the select gate line portion sandwiched between the two contacts of the select gate line $14_9$ or $14_{10}$ and the select gate over-adjacent wire $16_9$ or $16_{10}$. As described above, the select gate line is divided into several to several tens by the contact region with the select gate over-adjacent wire 16. As a result, it is possible to reduce the necessary charge/discharge time down to one-fifth to one-several tenth, as compared with the case where the select gate contact regions (V) and (VI) shown in FIG. 25 are not arranged in the memory cell.

As described above, in the conventional method of reducing the charge/discharge time to and from the above-mentioned select gate $14_9$ or $14_{10}$, that is, to reduce the effective resistance of the select gate $14_9$ or $14_{10}$, the select gate $14_9$ or $14_{10}$ is connected to the select gate over-adjacent wires $16_9$ or $16_{10}$ in bypass manner in the select gate contact regions (V) and (VI) shown in FIG. 25, respectively. Further, the resistance of the material of these select gate over-adjacent wires $16_9$ and $16_{10}$ is usually determined lower than that of the select gates $14_9$ and $14_{10}$, so that it is possible to reduce the effective resistance of the select gates $14_9$ and $14_{10}$ by connecting the select gate over-adjacent wires $16_9$ and $16_{10}$ to the select gates $14_9$ and $14_{10}$, respectively.

In the conventional method as described above, however, since the number of the contacts with the wires in the select gate contact regions (V) and (VI) is as large as three per select gate line (as understood in FIG. 27), the width of the select gate contact region must be widened. However, these gate contact regions exist at many positions of several tens in the memory cell array, the area of select gate contact regions increases with increasing width of one select gate region, so that there exists a problem in that the chip area increases markedly. Further, when the number of the select gate contact regions is decreased in the memory cell array, there arises another problem in that the charge/discharge time to and from the select gate increases, with the result that the necessary operation time including the select gate line charge/discharge operation time is lengthened.

On the other hand, FIG. 28 shows another conventional example in which two adjacent select gate lines (e.g., $SG_1$ and $SG_2$ of FIG. 25), only if both select gate lines are controled and driven in common, are formed integral with each other to bypass the select gate lines through a single bit line 18 simultaneously. However, since the cross-section of this example can be also shown in FIG. 26(b), the problems involved in this conventional example is the same as with the conventional case already explained.

Further, FIGS. 29(a) to 29(c) show still another example of the conventional method, in which the bit line 18 is formed by a wiring layer formed on the select gate lines 14 and 16 and further the bit line contact opening is tapered to increase the processing margin. In this method, as shown in FIG. 29(a), the contact hole is etched by anisotropic etching (RIE) and further by isotropic etching by leaving the resist $R_{10}$ to form the upper contact hole $C_{10}$. Since the upper contact hole $C_{10}$ can be formed, it is possible to prevent the wiring layer 18 from being cut off at the contact portion. In this method, however, when the isotropic etching rate is large, there exists a possibility that the wire 16 is shorted to the bit line 18. After that, as understood by FIG. 29(b), the lower contact hole $C_{11}$ is formed by the isotropic etching. After that, the resist $R_{10}$ has been removed, the bit line is buried in the formed hole.

As described above, in the conventional NAND type EEPROM, the width of the select gate contact regions must be determined wide. However, since these select contact gate regions exist at as many positions as several tens in the memory cell array, there exists a problem in that the chip area inevitably increases. In addition, when the number of the select gate contact regions is reduced in the memory cell array for prevention of an increase of the chip area, there arises the other problem in that the time required for charge/discharge to and from the select gage lines is lengthened and thereby the necessary operation time including the charge/discharge time to and from the select gate line is lengthened.

SUMMARY OF THE INVENTION

Accordingly, it is the object of the present invention to provide a NAND cell type EEPROM which can reduce the chip area markedly, as compared with the conventional chip area, without lengthening the necessary operation time including the charge/discharge to and from the select gate lines.

To achieve the above-mentioned object, the present invention provides a non-volatile semiconductor memory device having a memory cell array formed by arranging a plurality of non-volatile reloadable semiconductor memory cells and select gate elements on a semiconductor substrate via a gate insulating film, each memory cell being formed by interposing an interlayer insulating film between a charge storage layer and a control gate line, which comprises: a plurality of select gate lines formed by a wiring layer the same as the charge storage layer of the memory cells, as gate electrodes of the select gate elements; and select gate over-adjacent connect lines formed by a wiring layer the same as the control gate lines of the memory cells and located over the select gate lines via an insulating film, the select gate over-adjacent lines being kept floated without contacting with any other wires and potential nodes.

Further, in the non-volatile semiconductor memory device, a plurality of the memory cells are connected in series so as to form a memory cell bundle, and the select gate element is connected in series with one end of the memory cell bundle.

Further, in the non-volatile semiconductor memory device, a plurality of the memory cell bundles and a plurality of the select gate elements each connected to each of the memory cell bundles are arranged in a direction, respectively; the select gate lines of the respective select gate elements are connected in sequence so as to form a common select gate line; and further the select gate over-adjacent connect wires are connected to each other as a common select gate over-adjacent connect line.

Further, the non-volatile semiconductor memory device further comprises subsidiary select gate lines whose resistance is lower than that of the common select gate lines; and each of the subsidiary select gate lines and each of the common select gate lines are connected to each other at each predetermined position in such a way that each common select gate line is bypassed through each subsidiary select gate line to reduce virtual resistance of each common select gate line.

Further, in the non-volatile semiconductor memory device, the subsidiary select gate line is formed so as to face the common select gate line; the common select gate over-adjacent connect line is formed between the common select gate line and the subsidiary select gate line; the common select gate over-adjacent connect line is separated at predetermined intervals in a predetermined length; and the common select gate line and the subsidiary select gate line are connected to each other at each separation position in such a way that the common select gate line and the subsidiary select gate line enclose each separated common select gate over-adjacent connect line.

Further, in the non-volatile semiconductor memory device, the subsidiary select gate line and each separated common select gate over-adjacent connect line are connected to each other.

Further, in the non-volatile semiconductor memory device, the subsidiary select gate line is separated into a plurality of separated subsidiary select gate lines in a predetermined length.

According to the present invention, since the select gate over-adjacent wire is not used as the charge transfer path to the select gate line, the number of contacts between the select gate over-adjacent wire and the other wire can be reduced in the memory cell array, so that it is possible to narrow a width per select gate contact region. As a result, it is possible to reduce the area of the select gate contact region in the memory cell array markedly, without reducing the number of the select gate contact regions, that is, without lengthening the necessary operation time including the charge/discharge time to and from the select gate line, thus realizing a reduction of the chip area.

Further, since the select gate line and the select gate over-adjacent wire are both not connected to each other, even if the bit line is shorted to the select gate over-adjacent wire, it is possible to prevent the bit line from being shorted to the select gate line.

DETAILED DESCRIPTION OF THE EMBODIMENTS

Some embodiments of the present invention will be described hereinbelow with reference to the attached drawings.

Figure 1:
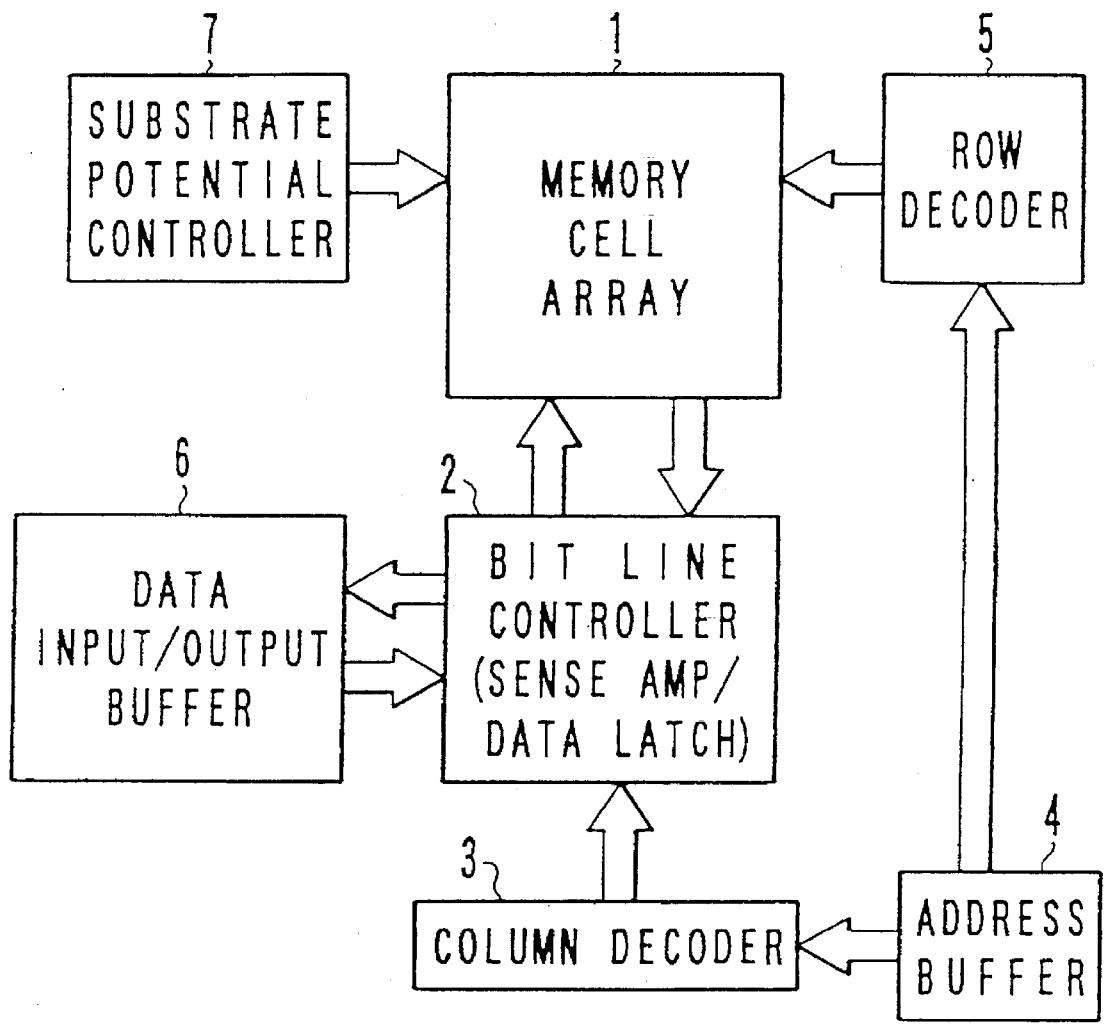
FIG. 1 is a block diagram showing a NAND type EEPROM related to the embodiments according to the present invention.

FIG. 1 is a block diagram showing an embodiment of the NAND type EEPROM according to the present invention. In FIG. 1, a bit line controller 2 is provided for a memory cell array 1, to execute data write, read, rewrite, write verify, read, and erase verify. Being connected to a data input/output buffer 6, the bit line controller 2 inputs an output of a column decoder 3 on the basis of an address signal applied by an address buffer 4. Further, a row decoder 5 is connected to the memory cell array 1 to control the control gates and select gates. Further, a reference potential controller 7 is provided to control the potential of a p-type substrate (or a p-type well) on which the memory cell array 1 is formed.

Figures 2A, 2B:
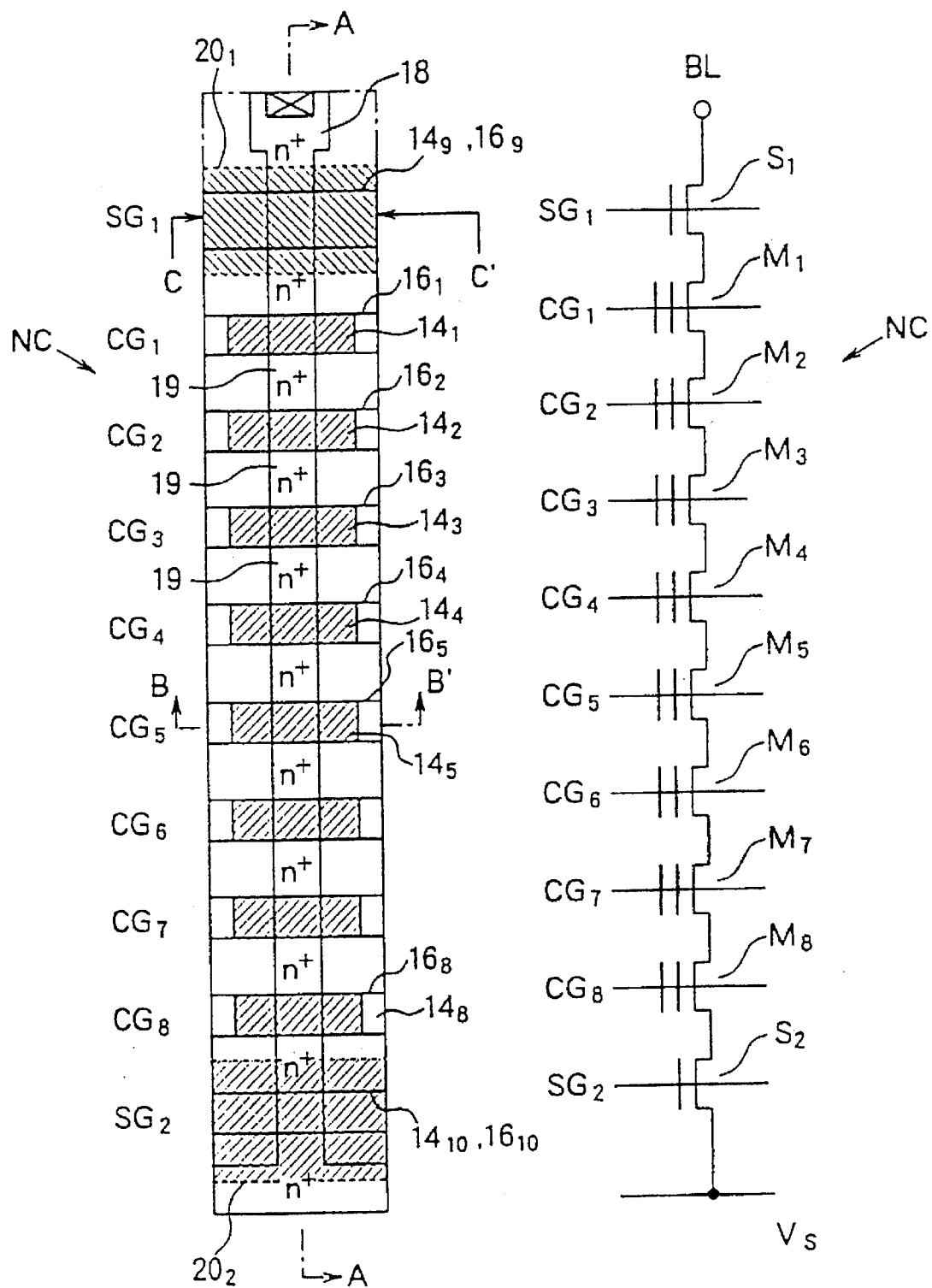
FIG. 2(a) is a plane view showing the construction of the NAND cell related to the first and second embodiments according to the present invention.
FIG. 2(b) is an equivalent circuit showing the construction of the NAND cell related to the first and second embodiments according to the present invention.
Figure 3:
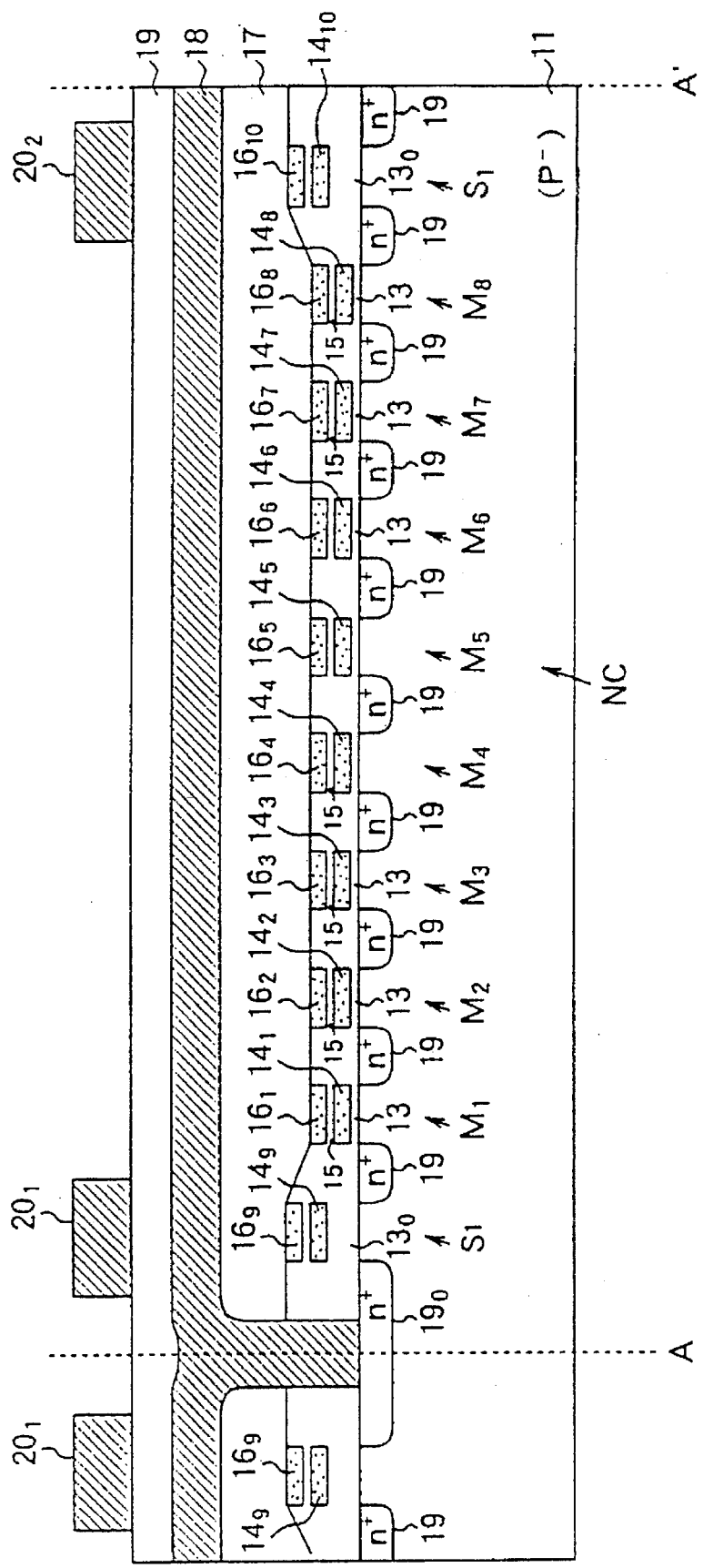
FIG. 3 is a cross-sectional view, taken along the line A–A' in FIG. 2(a)
Figure 4:
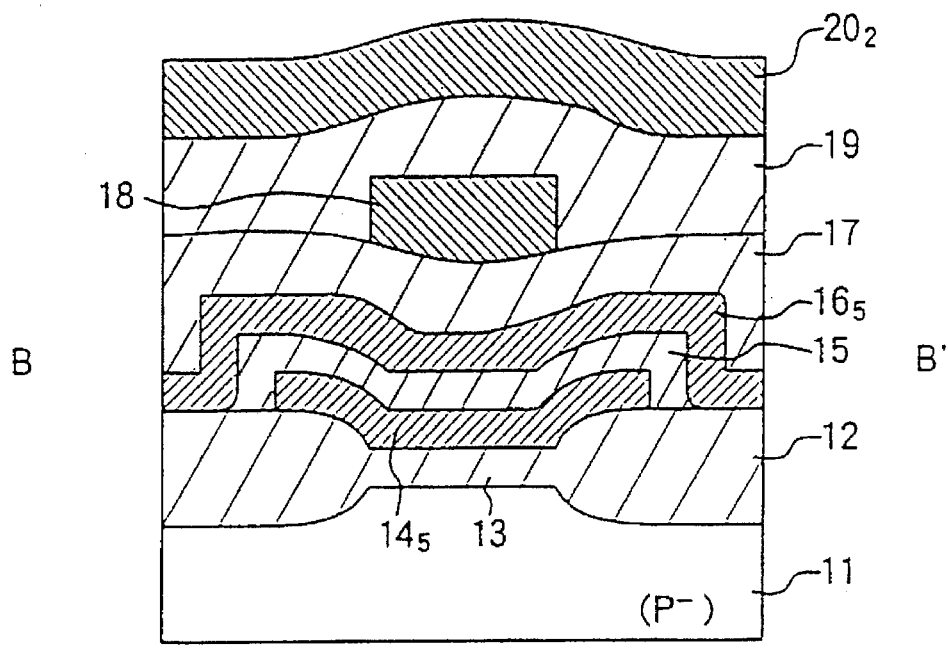
FIG. 4(a) is a cross-sectional taken along the line B–B' in FIG. 2(a)
FIG. 4(b) is a cross-sectional taken along the line C–C' in FIG. 2(a)
Figure 4:
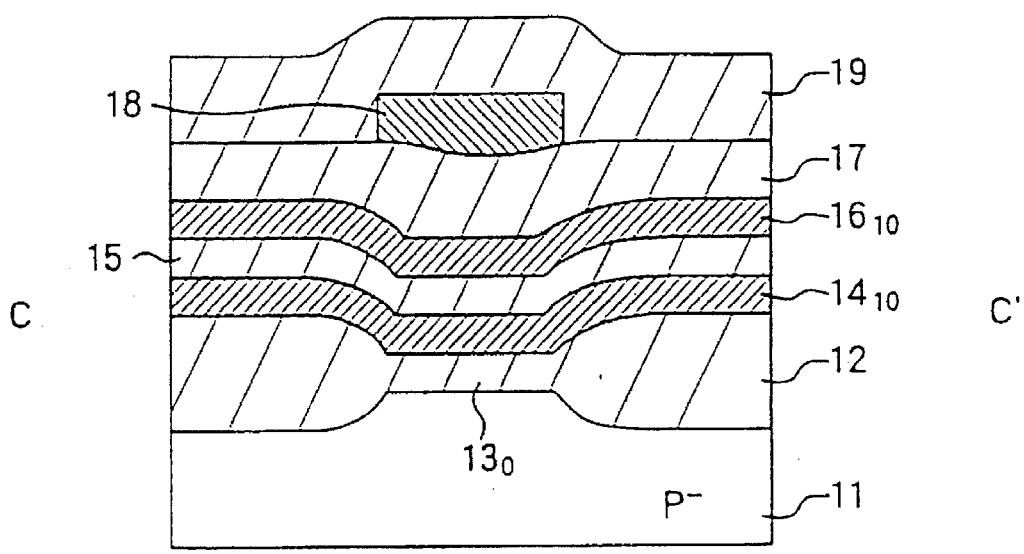
Figure 5:
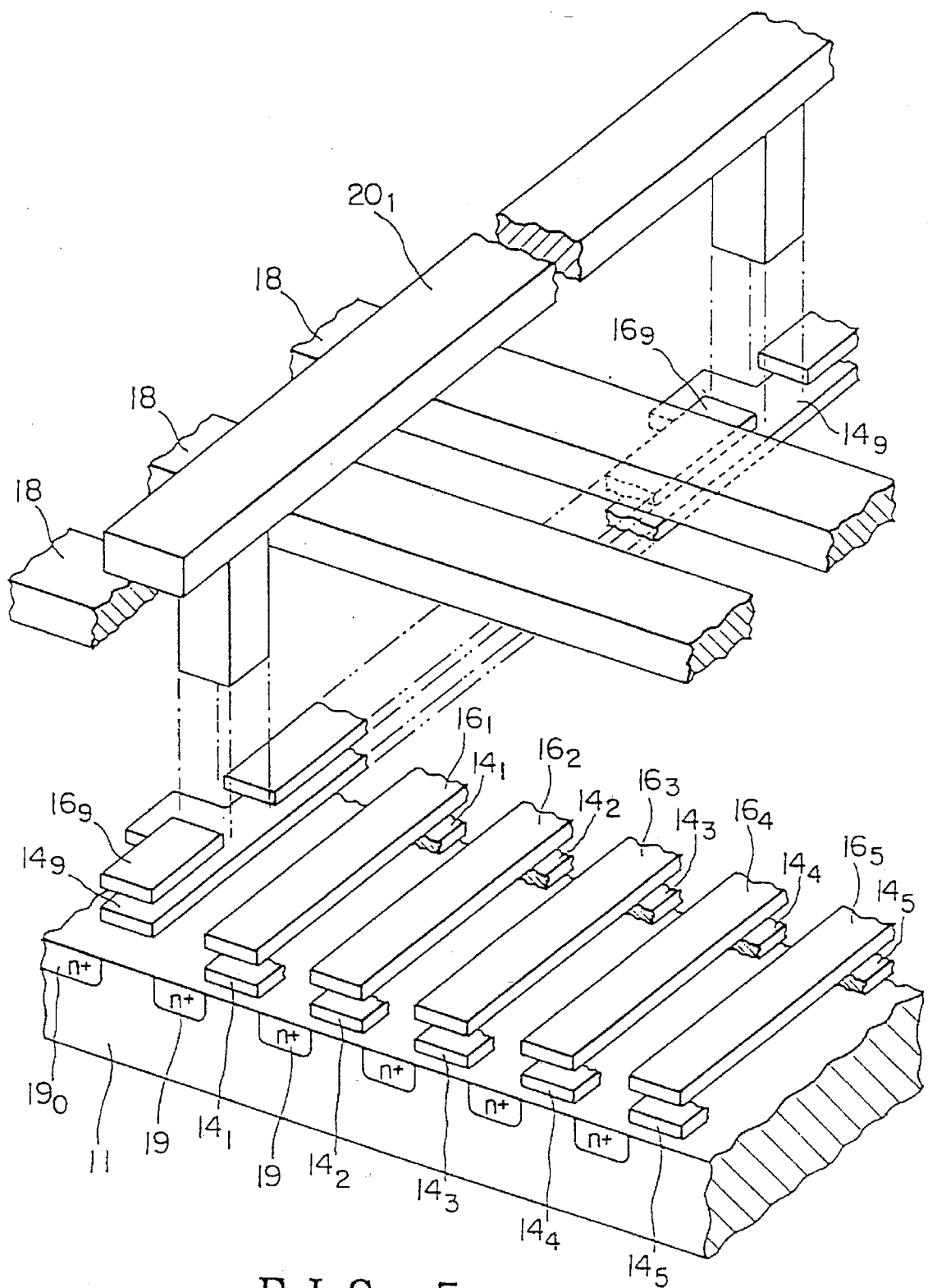
FIG. 5 is a perspective view showing an essential portion of the NAND cell structure shown in FIG. 3.

FIG. 2(a) is a plane view showing one NAND cell formed in the memory cell array 1, and FIG. 2(b) is an equivalent circuit thereof. Further, FIG. 3 is a cross-sectional view taken along the longitudinal direction A–A' in FIG. 2(a); and FIGS. 4(a) and 4(b) are cross-sectional views taken along the lateral lines B–B' and C–C' in FIG. 2(a), respectively. FIG. 5 is a partial perspective view showing a state where the respective elements shown in FIG. 3 are separated from each other. As understood with reference to FIG. 2(a) to FIG. 4(b) in particular, memory cell $M_i$ is formed at a portion enclosed by an element separating oxide film 12 (shown in FIGS. 4(a) and (b)) on the p-type silicon substrate (or p-type well) 11, and one NAND cell is composed of eight memory cells $M_i$. Further, the memory cell array 1 is composed of a plurality of NAND cells NC.

Further, as understood with reference to FIG. 3 in particular, each memory cell $M_i$ is constructed by forming a floating gate $14_i$ ($14_1$, $14_2$, ... $14_8$) on the substrate 11 via a gate insulating film 13 and further by forming control gate line $16_i$ ($16_1$, $16_2$, ... $16_8$) on the floating gate $14_i$ via an interlayer insulating film 15. An n-type diffusion layer 19 (the source-drain of these memory cells $M_i$) is formed in common for the adjacent memory cells $M_i$ so that the memory cells $M_i$ can be connected in series.

Further, as understood in FIG. 3, on each of both sides of the NAND cell NC, a select gate line $14_9$ or $14_{10}$ and a wire adjacent to the upper portion of the select gate (referred to as a select gate over-adjacent wire, hereinafter) $16_9$ or $16_{10}$ are formed. The select gate line $14_9$ or $14_{10}$ is formed together with the floating gates $14_i$, and the select gate over-adjacent wire $16_9$ or $16_{10}$ is formed together with the control gate lines $16_i$, respectively. The respective nodes $14_1$ to $14_{10}$ and $16_1$ to $16_{10}$ are formed by use of the self-alignment technique.

In FIG. 3, after the elements have been formed, the substrate 11 is covered with a CVD oxide film 17, and the bit lines 18 are formed on the CVD oxide film 17. The bit lines 18 are connected to a drain side diffusion layer $19_0$ as one end of the NAND cell. In FIG. 2, the control gate lines $16_i$ arranged in the column direction are arranged as the control gate lines $CG_1$, $CG_2$, ... $CG_8$ extending in the row direction. These control gate lines $CG_i$ are so-called word lines. The select gate lines $14_9$ and $14_{10}$ are arranged as the continuous select gate lines $SG_1$ and $SG_2$ extending in the row direction, respectively. Further, in the same way, the select gate over-adjacent wires $16_9$ and $16_{10}$ are arranged as the continuous wires extending in the row direction, respectively.

The select gate over-adjacent wires $16_9$ and $16_{10}$ are essential to increase the processing reliability of the control gate lines $16_1$ to $16_8$. Where there exist no select gate over-adjacent wires $16_9$ and $16_{10}$, no layer formed of the same material as the control gate lines $16_i$ exists outside of the control gate lines $16_1$ and $16_8$. In this case, since the processing periodicity of the control gate lines $16_1$ to $16_8$ cannot be established, that is, since the wiring material is arranged periodically only between the lines $16_1$ to $16_8$, there exists a possibility that the reliability of the processed shape of the lines $16_1$ to $16_8$ deteriorates. Therefore, the lines $16_1$ to $16_8$ are so-called control gate electrodes for the memory cells M1 and M8. Further, if the processed shape is not stabilized as described above, the memory cell characteristics deteriorate, thus causing defective memory cells. Accordingly, the above-mentioned stability of the processed shapes of the memory cells is a necessary condition for the memory cells absolutely. To realize the above-mentioned stability of the processed shape, the select gate over-adjacent wires $16_9$ and $16_{10}$ must be formed adjacent to the upper portion of the select gate lines $14_9$ and $14_{10}$, respectively. In other words, the periodicity of the wire material processing process can be maintained all over the region between the two select gate over-adjacent wires $16_9$ and $16_{10}$ by the presence of the select gate over-adjacent wires $16_9$ and $16_{10}$, with the result that the processing stability of the control gate lines $16_1$ to $16_8$ can be realized. Therefore, the select gate over-adjacent wires $16_9$ and $16_{10}$ are indispensable wires for realization of the processing stability of the control gate lines.

Further, in FIG. 3, the CVD oxide film 19 is formed on the bit lines 18, and further subsidiary select gate lines $20_1$ and $20_2$ the same in potential as the select gates $14_9$ and $14_{10}$ are arranged on the CVD oxide film 19. To form the subsidiary select gate lines $20_1$ and $20_2$, a material whose resistance is lower than that of the select gate lines $14_9$ and $14_{10}$ is used.

Further, in FIG. 3, it is preferable to form the thickness of the gate insulating film $13_0$ formed between the select gate lines $14_9$ and $14_{10}$ thicker than that of the gate insulating film 13 formed in the memory cell portions, for improvement of the reliability.

Figure 6:
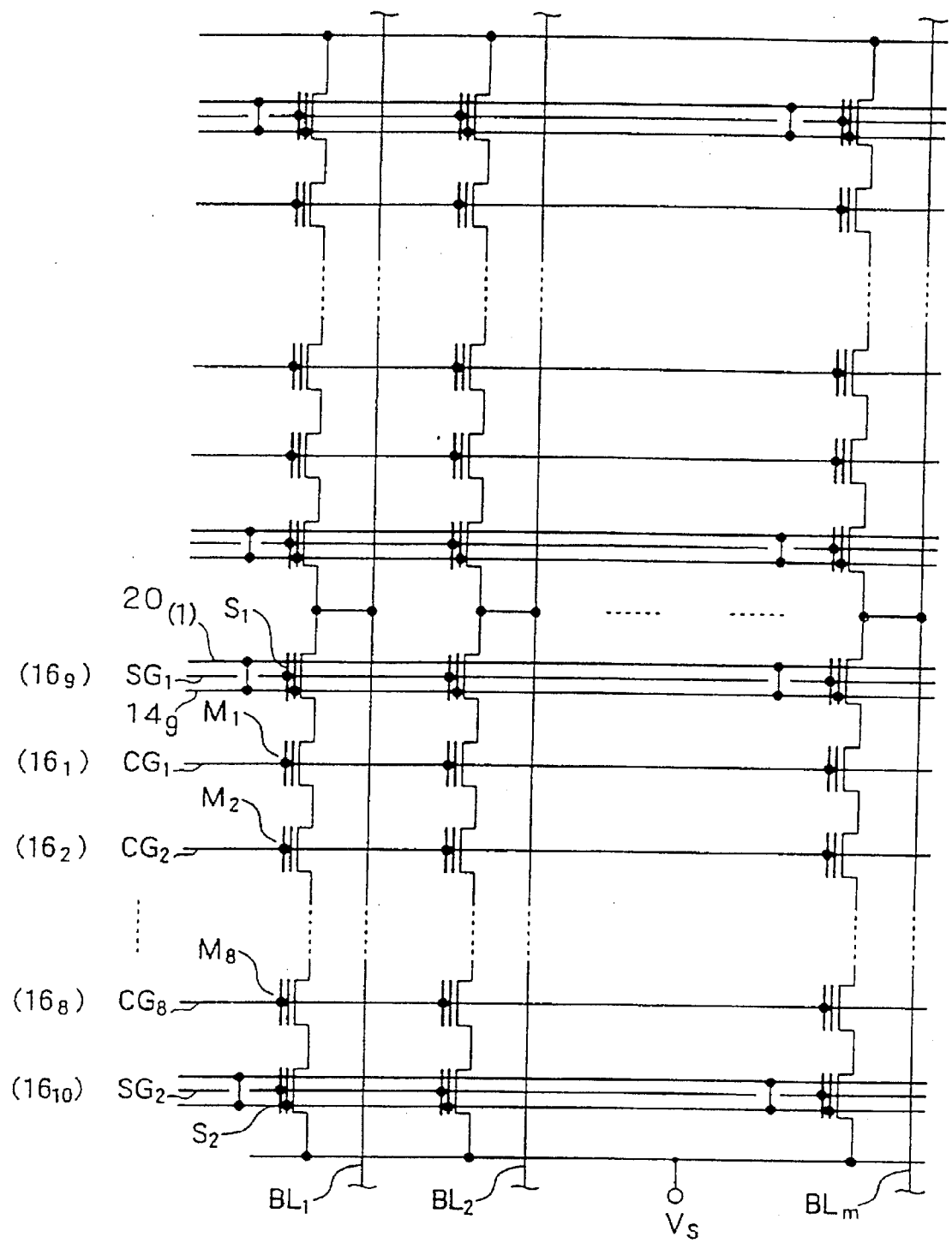
FIG. 6 is an equivalent circuit diagram showing the same memory cell array.

FIG. 6 is an equivalent circuit of the memory cell array in which the NAND cells as described above are arranged as a matrix pattern.

Figure 7:
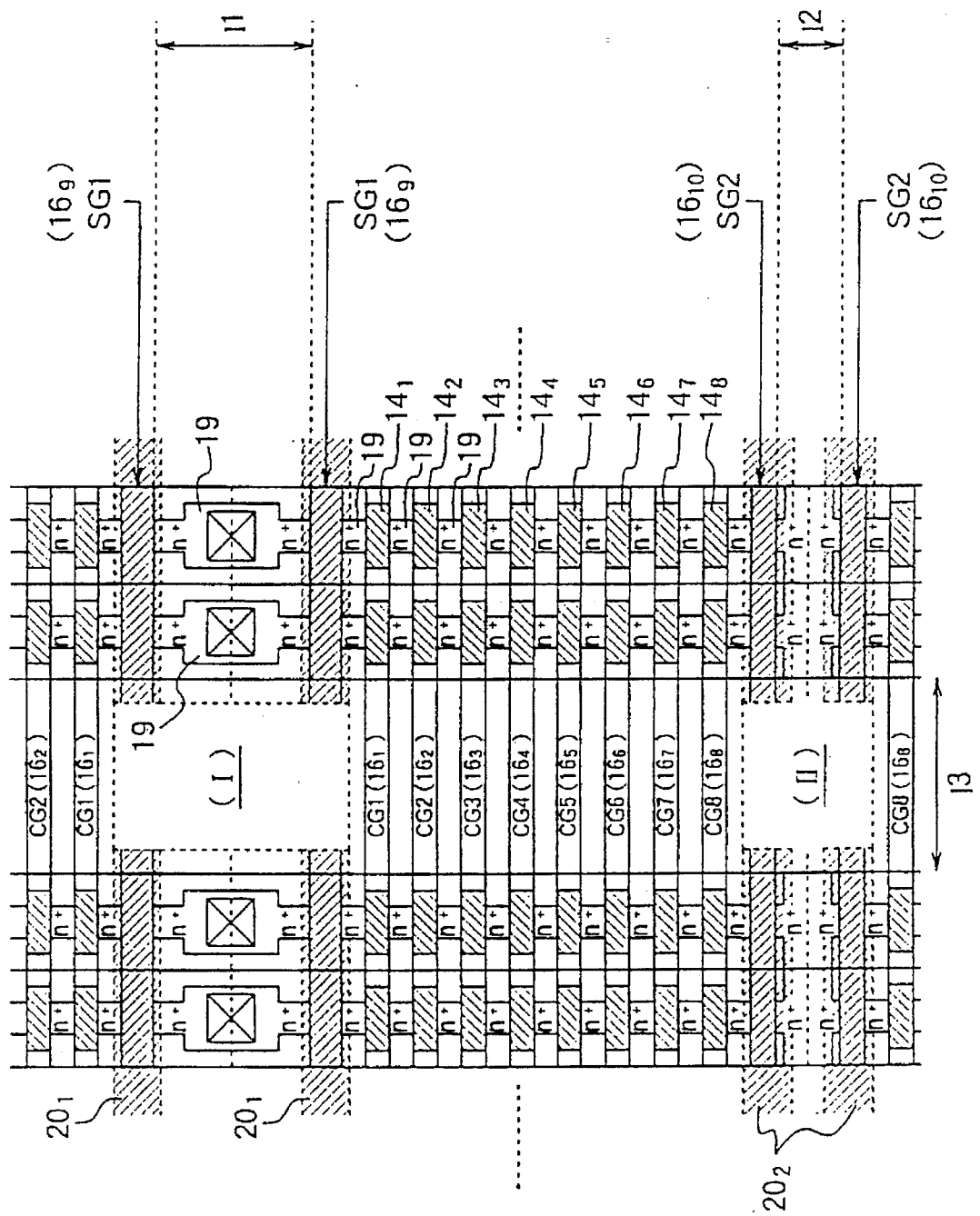
FIG. 7 is a plane view showing the arrangement of a plurality of NAND cells of the same memory cell array.

FIG. 7 is a plane view showing a plurality of NAND cells arranged in the memory cell array. The select gate lines $14_9$ and $14_{10}$ are usually formed of a material of high resistance. Therefore, the necessary charge/discharge time to and from the select gate lines $14_9$ and $14_{10}$ is long. The gate electrodes SG1 and SG2 for driving the elements S1 and S2 shown on both ends in FIG. 2(b) are the node (the select gates) $14_9$ and $14_{10}$. Therefore, when the necessary charge/discharge time to and from the select gates $14_9$ and $14_{10}$ is long, there arises a problem in that the entire operation time including the charge/discharge operation to and from the select gates is lengthened. To shorten the necessary operation time, a method of reducing the effective resistance of the select gate lines $14_9$ and $14_{10}$ in the memory cell is adopted. To realize this method, two regions (I) and (II) (referred to as select gate contact regions, hereinafter) shown in FIG. 7 are formed.

Figure 8:
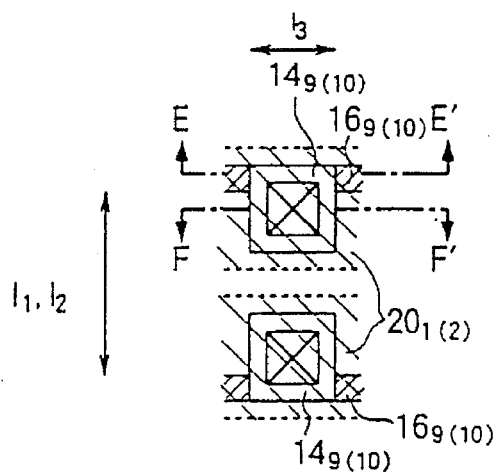
FIG. 8(a) is a plane view showing the select gate contact region (shown in FIGS. 7 and 15) related to the first and third embodiments according to the present invention.
FIG. 8(b) is a cross-sectional view taken along the line E–E' in FIG. 8(a)
FIG. 8(c) is a cross-sectional view taken along the line F–F' in FIG. 8(a)
Figure 8:
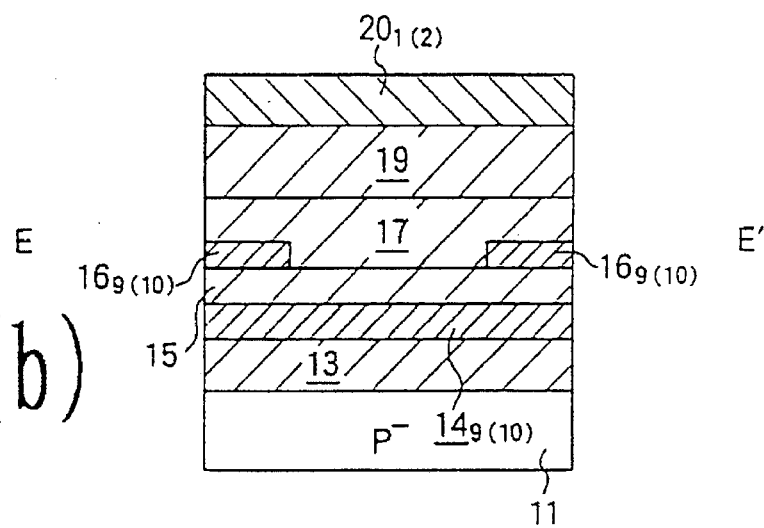
Figure 8:
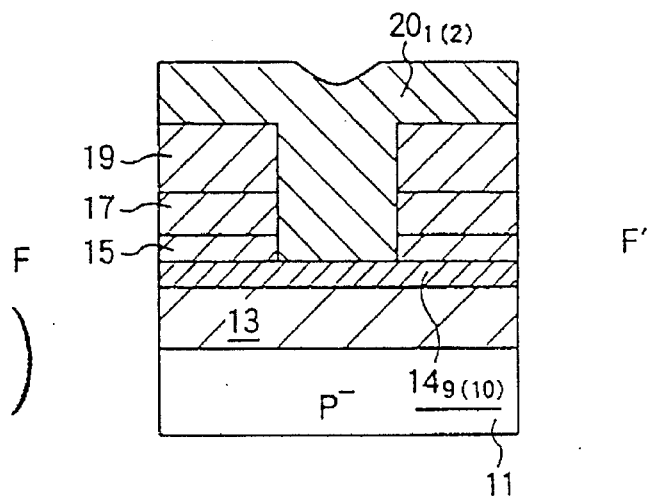
Figure 9:
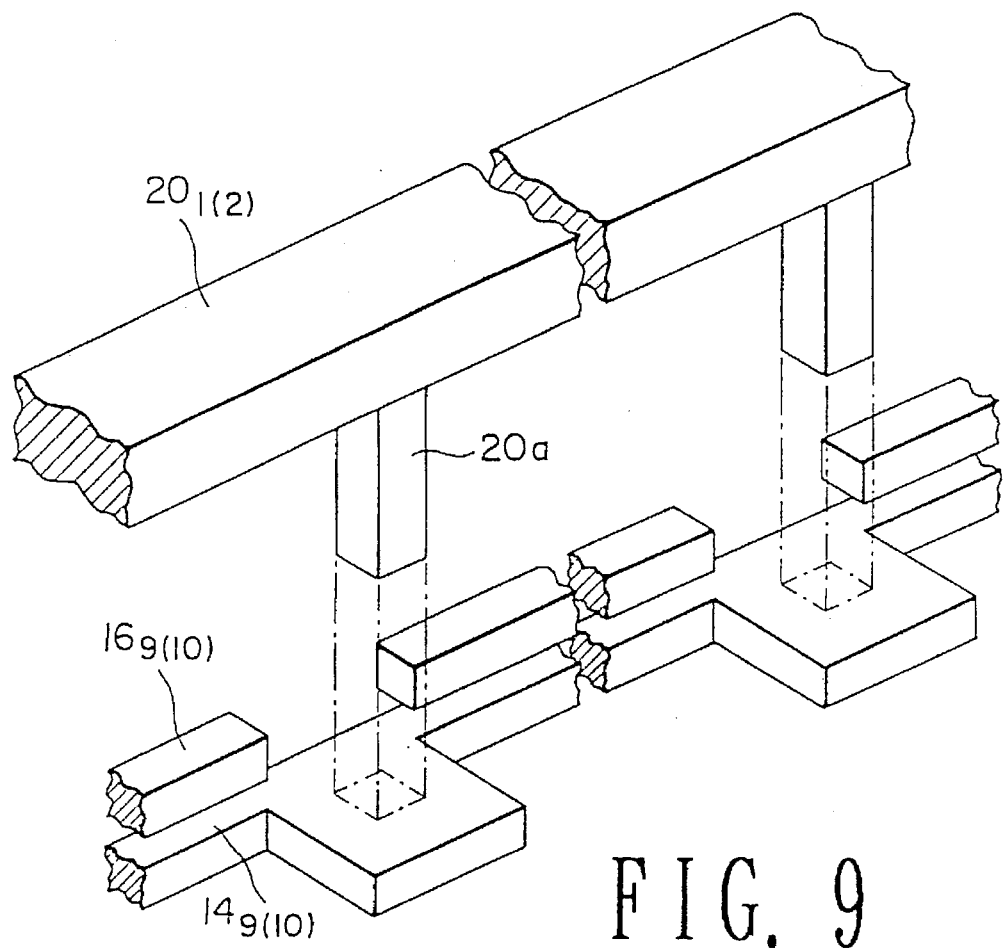
FIG. 9 is a perspective view showing an essential portion of the select gate contact region shown in FIG. 8(c)
Figure 16:
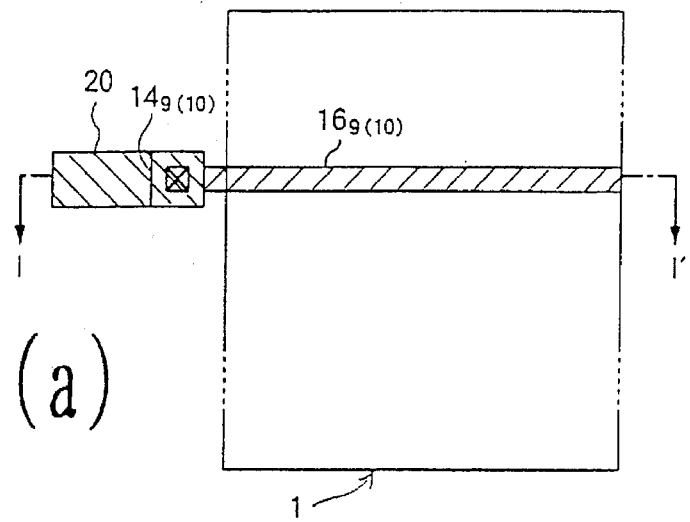
FIG. 16(a) is a plane view showing the connection of the select gate line, the select gate over-adjacent wire, and the subsidiary select gate line at the select gate line input section in and to the memory cell array.
FIG. 16(b) is a cross-sectional view showing the wiring related to the fifth embodiment according to the present invention.
FIG. 16(c) is a cross-sectional view showing the wiring related to the fifth embodiment according to the present invention.
Figure 16:
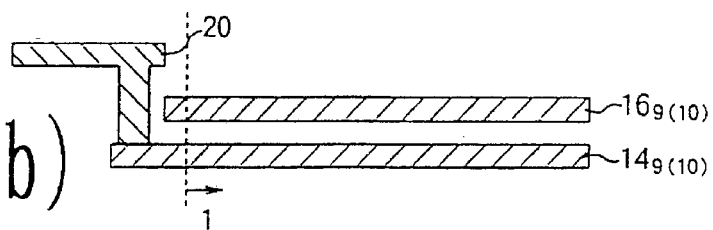
Figure 16:
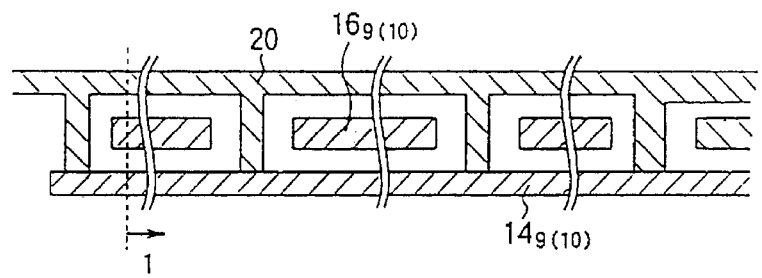

FIG. 8(a) shows a practical example of the select gate contact region (I) or (II) shown in FIG. 7. In FIG. 8(a), the node $14_9$ or $14_{10}$ is connected to the subsidiary select gate line $20_1$ or $20_2$ in the select gate contact region (I) or (II), respectively. FIG. 8(b) is a cross-sectional view taken along the line E–E' shown in FIG. 8(a), and FIG. 8(c) is a cross-sectional view taken along the line F–F' shown in FIG. 8(a). Further, FIG. 9 is a perspective view showing the portion shown in FIG. 8(c). When the method as shown in FIG. 8(a) is used, since the subsidiary gate line $20_1$ or $20_2$ formed of a wiring material whose resistance is lower than that of the select gate line $14_9$ or $14_{10}$ can be connected to the select gate line $14_9$ or $14_{10}$ in bypass manner within the memory cell, it is possible to reduce the effective resistance of the select gate line $14_9$ or $14_{10}$. When the select gate contact regions (I) and (II) as shown in FIG. 7 are provided at intervals of several tens or several hundreds of bit lines, it is possible to arrange the select gate contact regions at least several tens of positions in the memory cell array. In this case, the necessary charge/discharge time to and from the select gate lines $14_9$ or $14_{10}$ is determined mainly by the charge/discharge time to and from the wiring portion of high resistance, that is, by the charge/discharge time to and from the select gate line portion sandwiched between the contacts of the select gate line $14_9$ or $14_{10}$ and the subsidiary select gate line $20_1$ or $20_2$. In this case, as described above, the select gate line 14 can be divided into several to several tens divisions due to the contacts with the subsidiary gate line 20. Therefore, as compared with when the select gate contact regions (I) and (II) are not arranged in the memory cell, it is possible to reduce the necessary charge/discharge time down to one-fifth or sixth to one-several tenth. In addition, since the select gate over-adjacent wires $16_9$ and $16_{10}$ are not connected to any other wires in the select gate contact regions (I) and (II) shown in FIG. 7, these select gate over-adjacent wires $16_9$ and $16_{10}$ are always in floating status in the memory, as shown in FIG. 16(b). As already explained with reference to FIGS. 2(a), 2(b) and 3, even if floated, the select gate over-adjacent wires $16_9$ and $16_{10}$ are indispensable to realize the processing stability of the control gate lines and therefore cannot be omitted. As described above, the feature of the embodiment shown in FIGS. 8(a) to 8(c) and FIG. 9 is that the select gate over-adjacent wires $16_9$ and $16_{10}$ are formed under floating condition in the memory cell array.

Here, the advantage of the first embodiment will be described hereinbelow in comparison with the conventional memory cell array.

Figure 22:
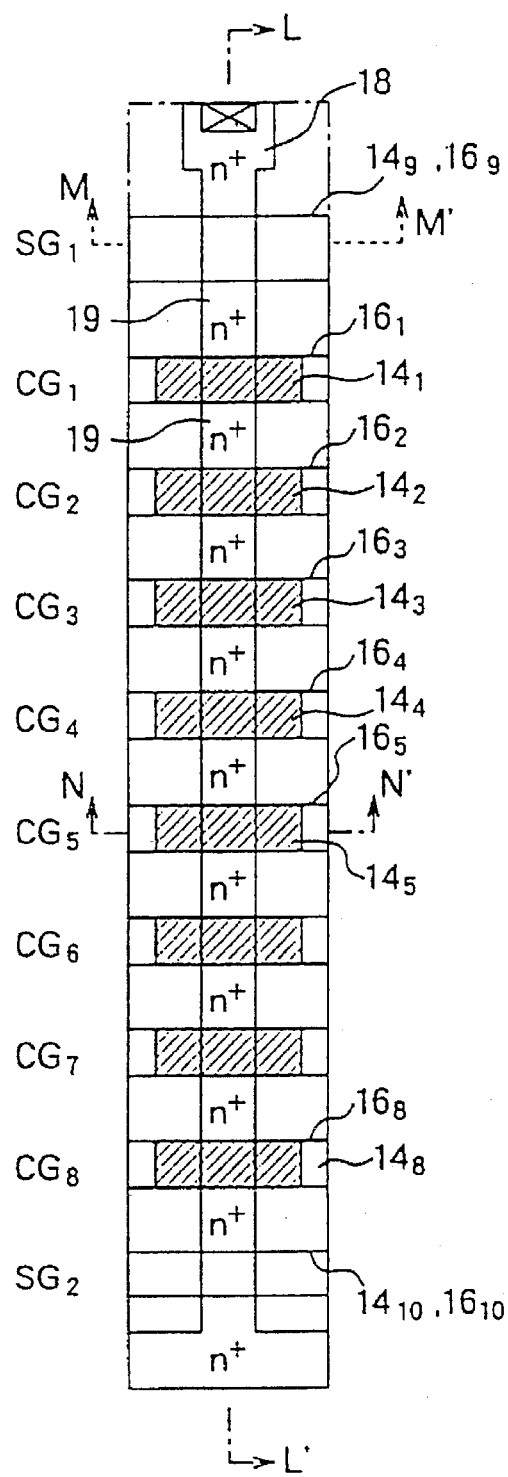
FIG. 22(a) is a plane view showing the construction of the conventional NAND cell.
FIG. 22(b) is an equivalent circuit showing the construction of the conventional NAND cell.
Figure 22:
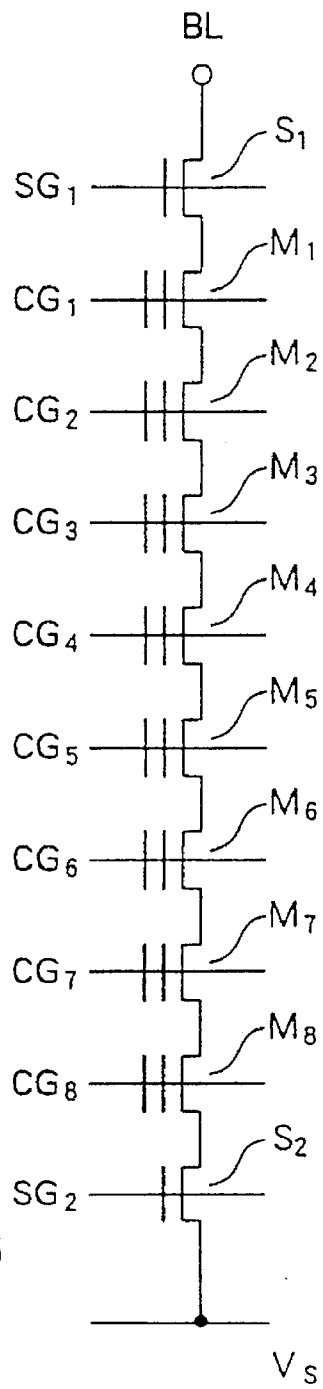
Figure 23:
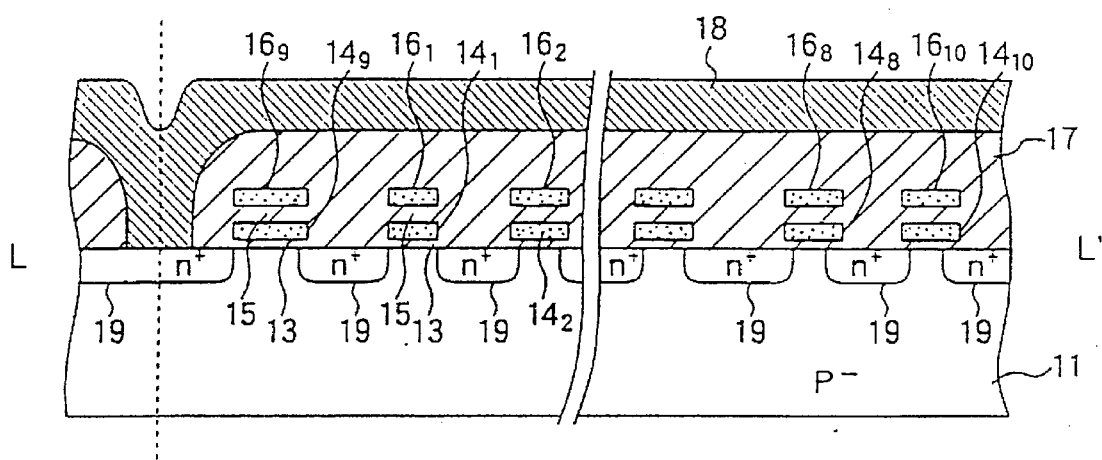
FIG. 23 is a cross-sectional view, taken along the line L–L' in FIG. 22(a)
Figure 24:
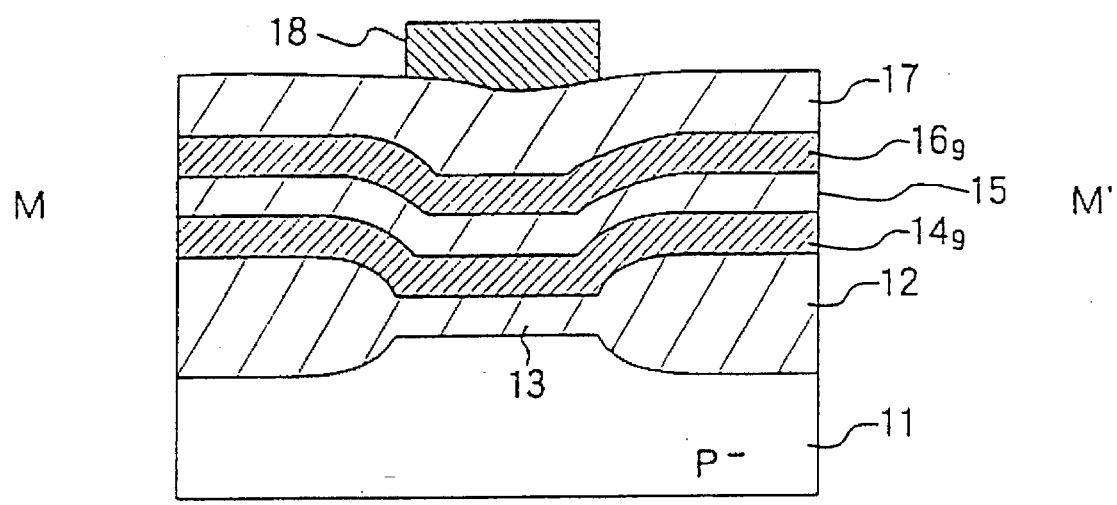
FIG. 24(a) is a cross-sectional taken along the line M–M' in FIG. 22(a)
FIG. 24(b) is a cross-sectional taken along the line N–N' in FIG. 22(a)
Figure 24:
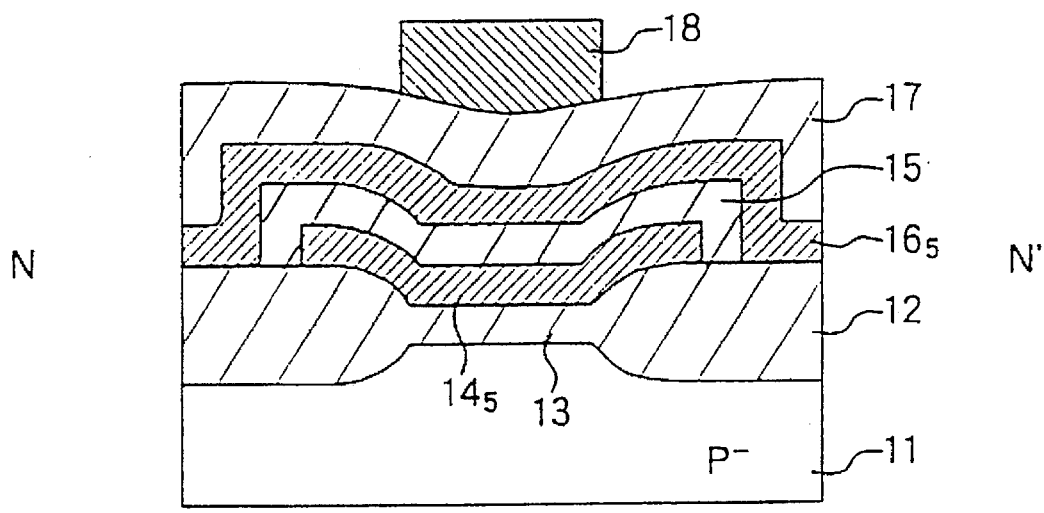
Figure 25:
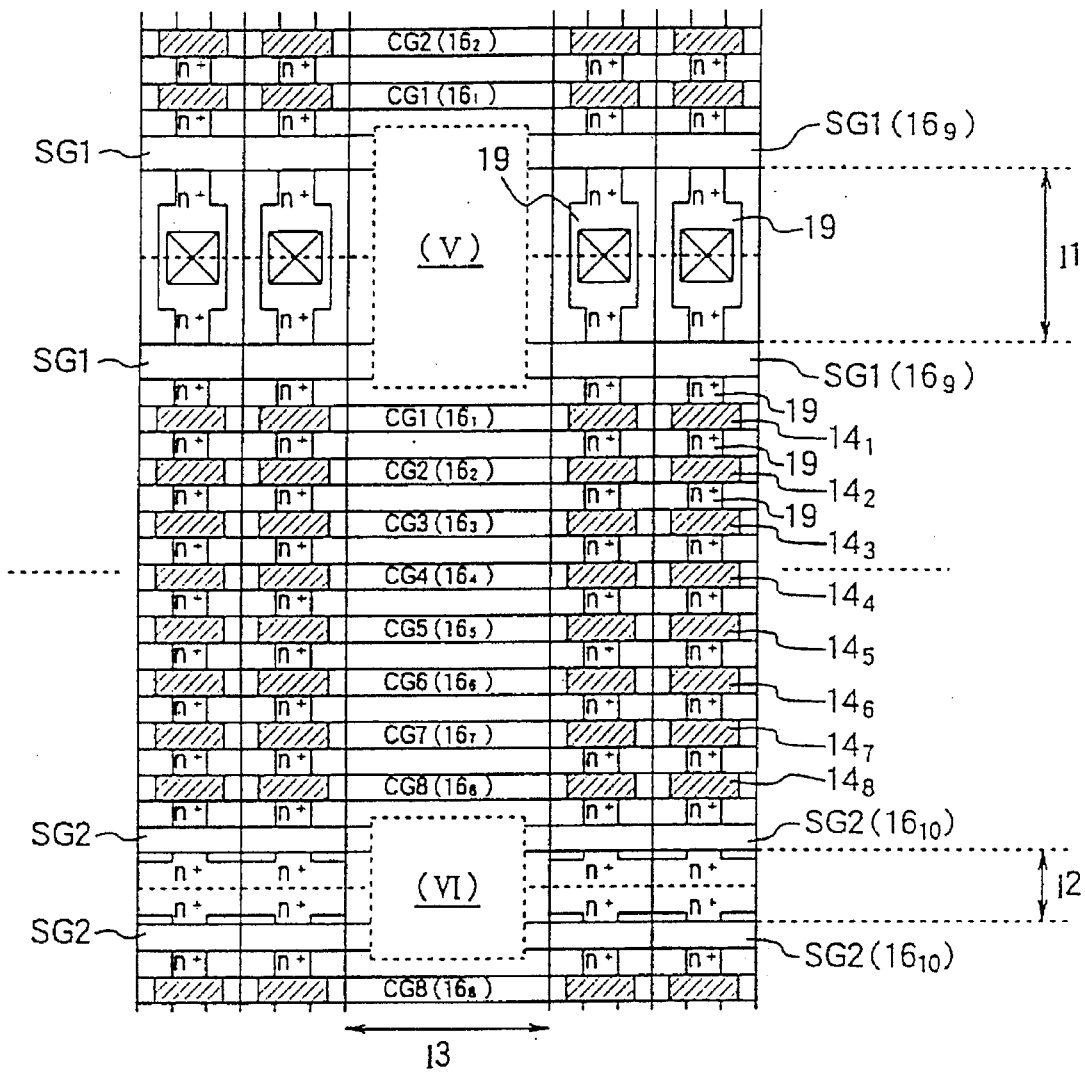
FIG. 25 is a plane view showing the arrangement of a plurality of the conventional NAND cells.
Figure 26:
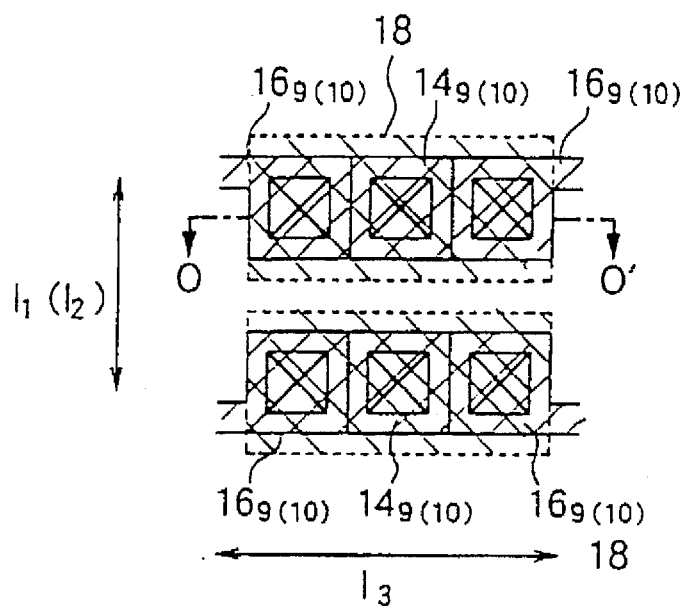
FIG. 26(a) is a plane view showing the select gate contact region (shown in FIGS. 7 and 15) related to the conventional NAND cell array.
FIG. 26(b) is a cross-sectional view taken along the line O–O' in FIG. 26(a)
Figure 26:
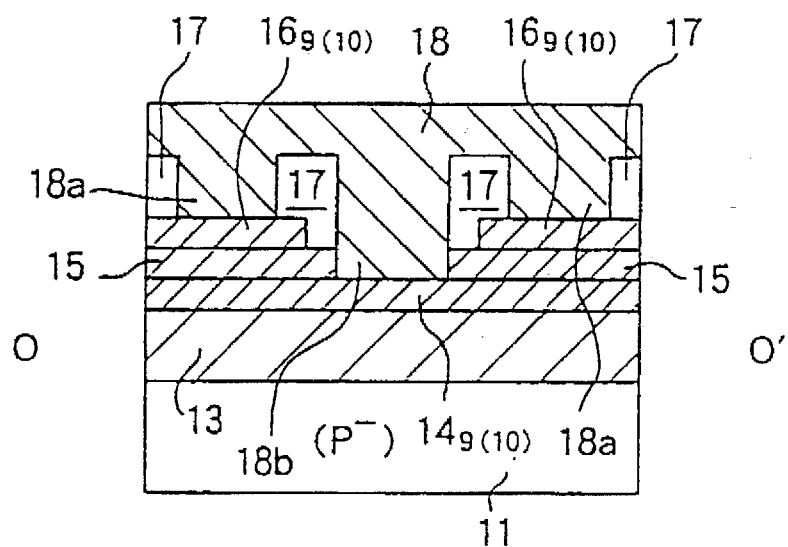
Figure 27:
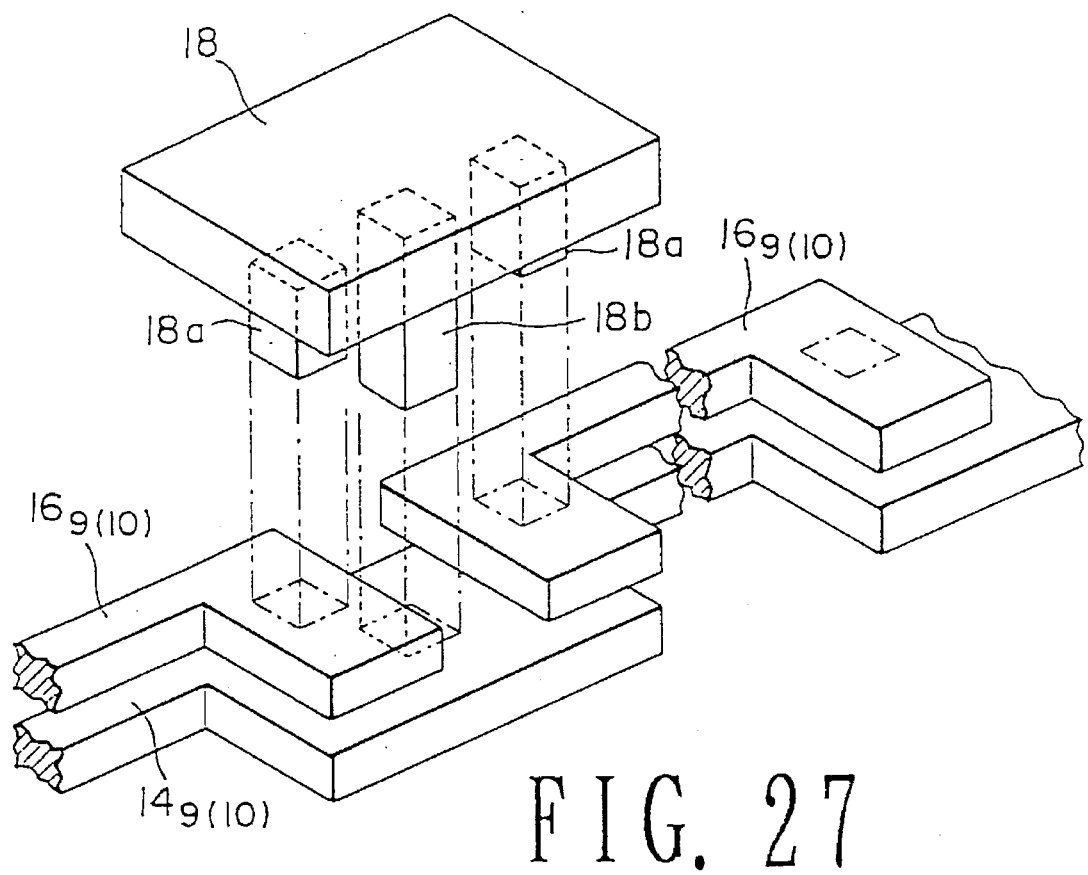
FIG. 27 is a perspective view showing an essential portion of the select gate contact region of the conventional NAND cell array shown in FIG. 26(b)

FIG. 22(a) is a plane view showing one NAND cell of the conventional memory cell array and FIG. 22(b) is an equivalent circuit thereof. Further, FIG. 23 is a cross-sectional view taken along the longitudinal line L–L' shown in FIG. 22(a); and FIGS. 24(a) and 24(b) are cross-sectional views taken along the lines M–M' and N–N' both shown in FIG. 22(a), respectively. Further, FIG. 25 is a plane view showing the arrangement of a plurality of the NAND cells in the conventional memory cell array. Further, FIG. 26(a) shows an example of the conventional memory cell array of the select gate contact region (which correspond to those shown by (V) or (VI) in FIG. 25). In the conventional memory cell array, to shorten the charge/discharge time to and from the select gate line, that is, in order to reduce the effective resistance of the select gate line 14, the select gate over-adjacent wires $16_9$ or $16_{10}$ is also connected to the select gate line $14_9$ or $14_{10}$, respectively in the select gate contact region (V) or (VI) shown in FIG. 25. In this case, in usual, the resistance of the wiring material of the select gate over-adjacent wires $16_9$ or $16_{10}$ is determined lower than that of the select gate line $14_9$ or $14_{10}$. Therefore, it is possible to reduce the effective resistance of the select gate line $14_9$ or $14_{10}$ by connecting the select gate over-adjacent wires $16_9$ or $16_{10}$ to the select gate line $14_9$ or $14_{10}$. In the conventional method, however, since the number of the contacts with the wire 16 in the select gate contact region (V) or (VI) is as large as three per select gate line 14, as shown in FIG. 27, the width of the select gate contact region must be widened. In the case of the first embodiment (as shown in FIG. 9), on the other hand, since the number of the contacts of the wire in the select gate contact region (V) or (VI) is as small as one per select gate line 14, so that it is possible to reduce the width of the select gate contact region (V) or (VI) down to about ⅓ of that of the conventional memory cell array. Here, since about several tens of the select gate contact regions exist in the memory cell array, the area of the select gate contact regions of the first embodiment is three times smaller than that of the conventional memory cell array. As a result, when the method of the first embodiment according to the present invention is adopted, it is possible to reduce the chip area markedly. Here, in the first embodiment of the present invention, the wiring layer for forming the wire (the subsidiary select gate line) 20 is additionally formed. In the present invention, however, it is possible to more effectively reduce the cost of the memory cell array by decreasing the chip area, in comparison with an increase of the cost due to the formation of the additional wiring layer 20. Further, even if the structure of the memory cell array is the same as with the case of the conventional one, in the case where a wire corresponding to the wire 20 is already used for wiring the sense amplifiers, the row decoders, and other circuit patterns (i.e., where the wire used for the elements other than the memory cell array is previously formed), it is possible to realize the first embodiment of the present invention without increasing the number of the wiring layers in the chip. Accordingly, the present invention is effective in the above-mentioned case, in particular.

Figure 6A:
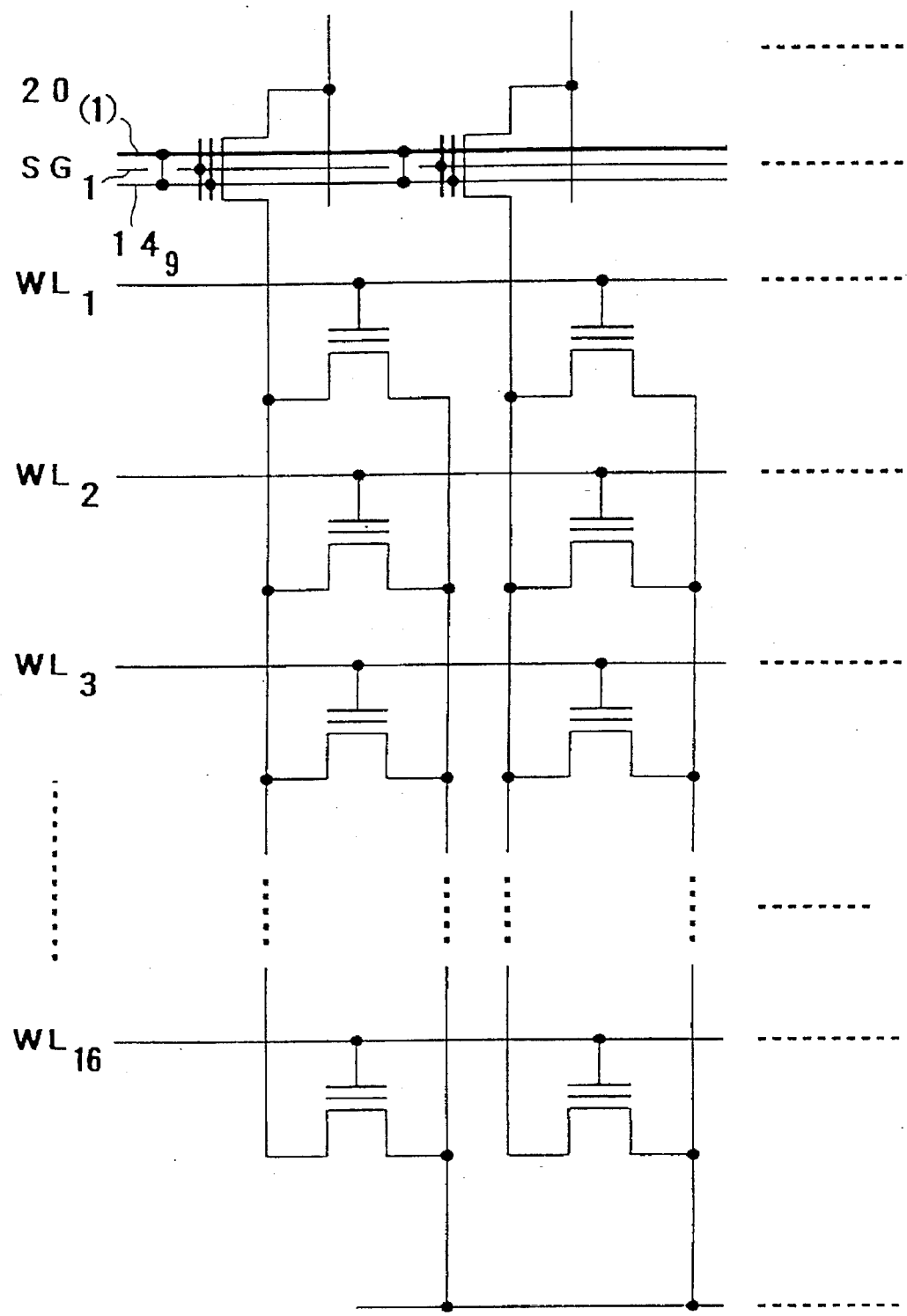
FIG. 6A is a circuit diagram showing another example, in which the present invention is applied to a device having a plurality of so-called DINOR cells.
Figure 6B:
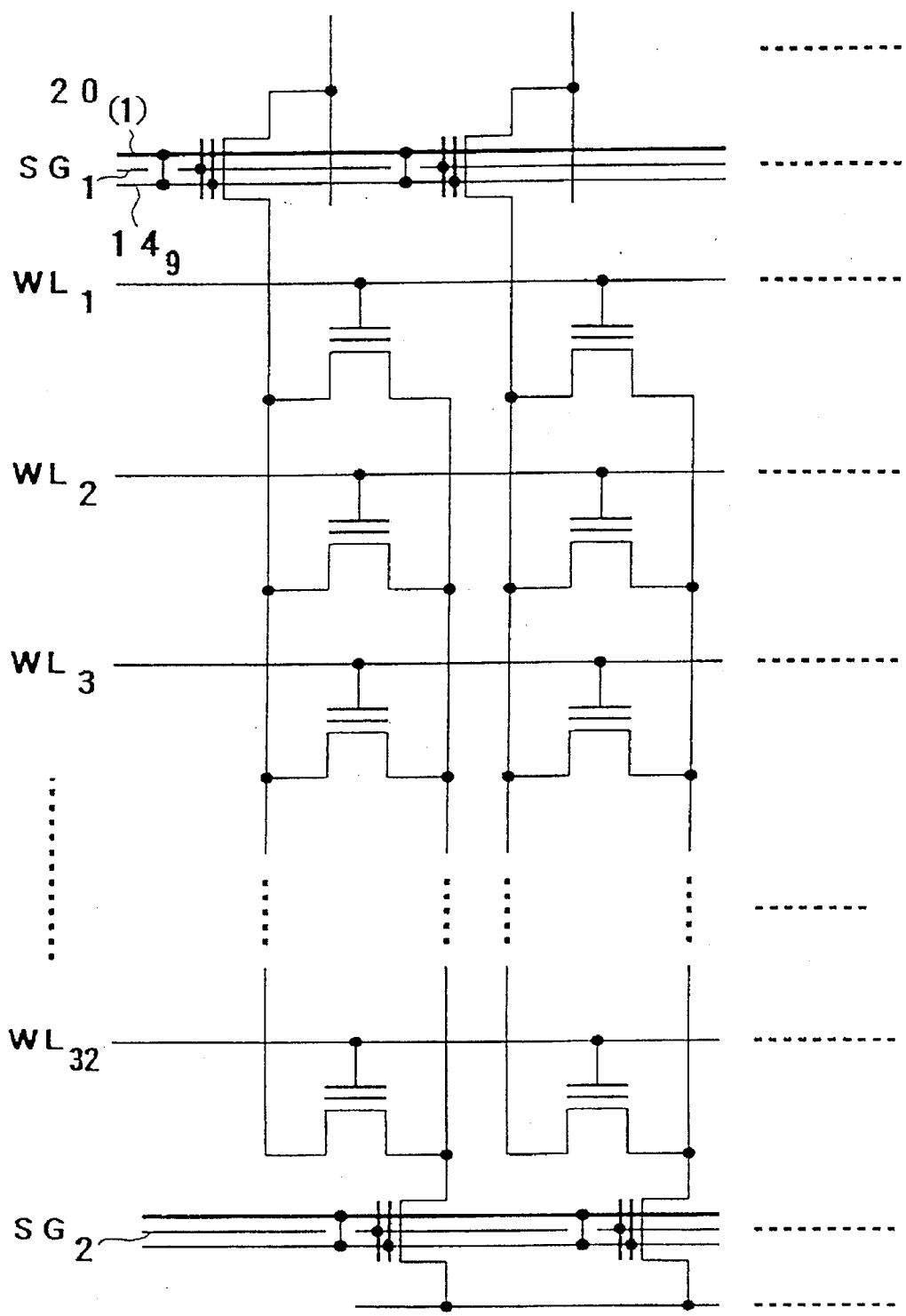
FIG. 6B is a circuit diagram showing another example, in which the present invention is applied to a device having a plurality of AND cells.

Further, FIGS. 6A and 6B show other examples of the device according to the present invention, in which the select gate transistors can be turned on or off by use of the select signal transmission lines of three-layer structure as shown in FIG. 5.

In the example shown in FIG. 6A, the device is composed of a plurality of so-called DINOR cells, in which the drains of the 16 memory cells M are connected in common to each of the bit lines $BL_i$ via a select gate transistor $S_1$, respectively. On the other hand, the sources of these memory cells M are also connected in common to a common source line CSL.

Further, in the example shown in FIG. 6B, the device is composed of a plurality of AND cells, which is different from that shown in FIG. 6A in that the device is provided with 32 memory cells M and further a second select gate transistor $S_2$ is connected between the sources of the 32 memory cells M and a common source line CSL, respectively.

Without being limited to only the above-mentioned first embodiment, the present invention can be modified in various ways. Therefore, the other embodiments will be explained hereinbelow.

Figure 10:
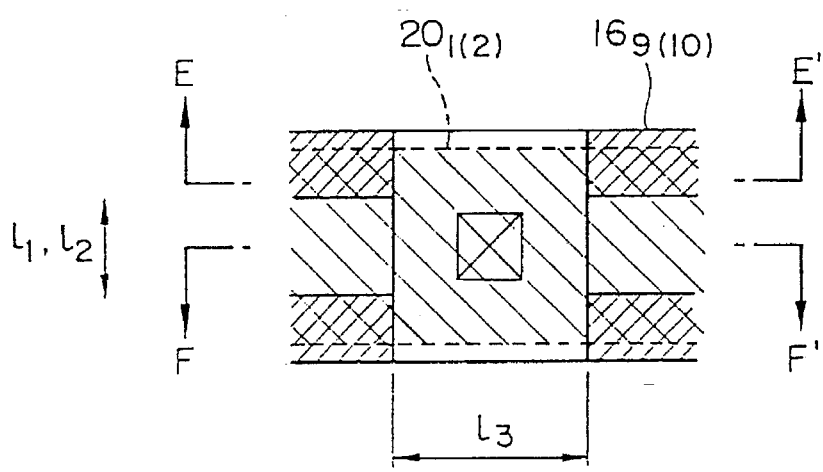
FIG. 10 is a plane view showing a modification of the select gate contact region shown in FIG. 8.
Figure 13:
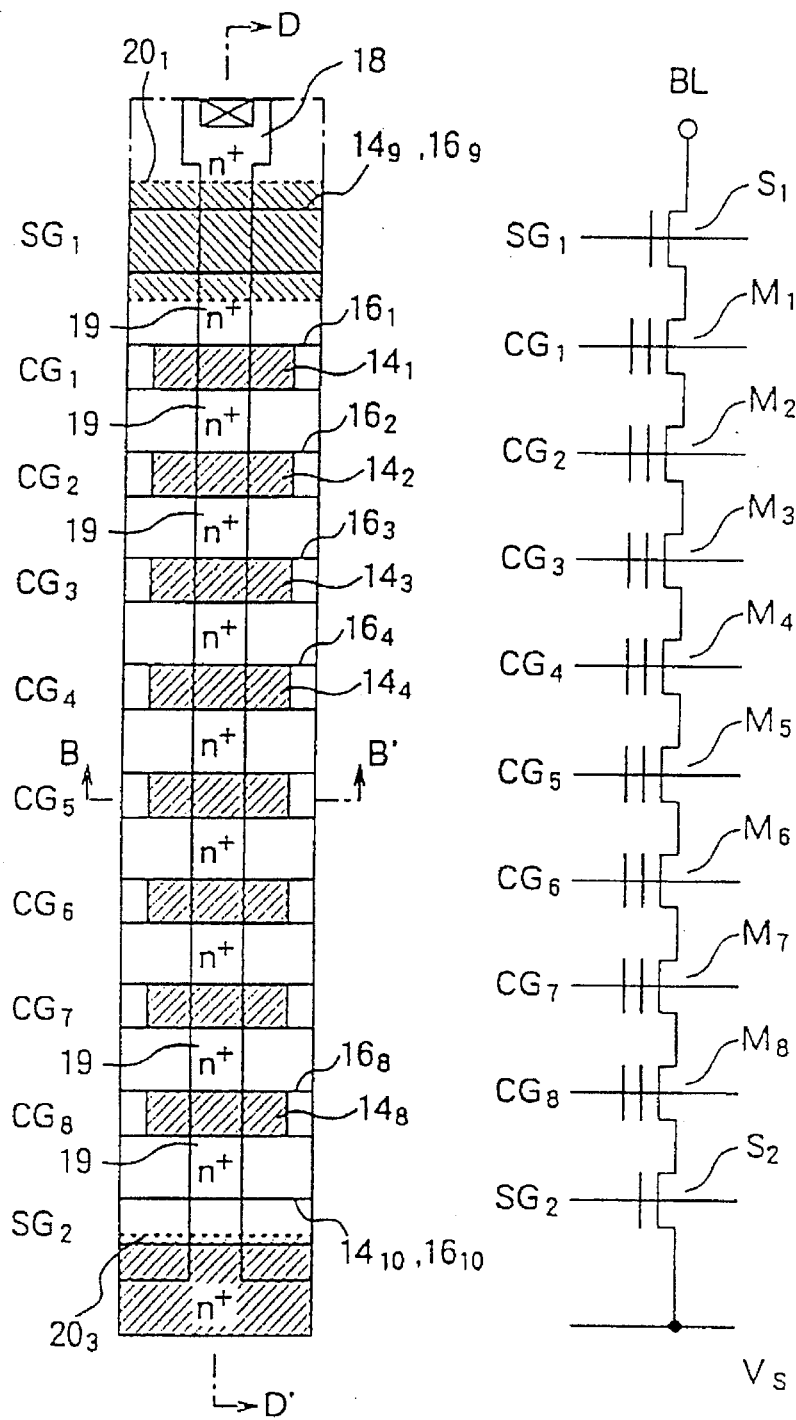
FIG. 13(a) is a plane view showing the construction of the NAND cell related to the third and fourth embodiments according to the present invention.
FIG. 13(b) is an equivalent circuit showing the construction of the NAND cell related to the third and fourth embodiments according to the present invention.
Figure 14:
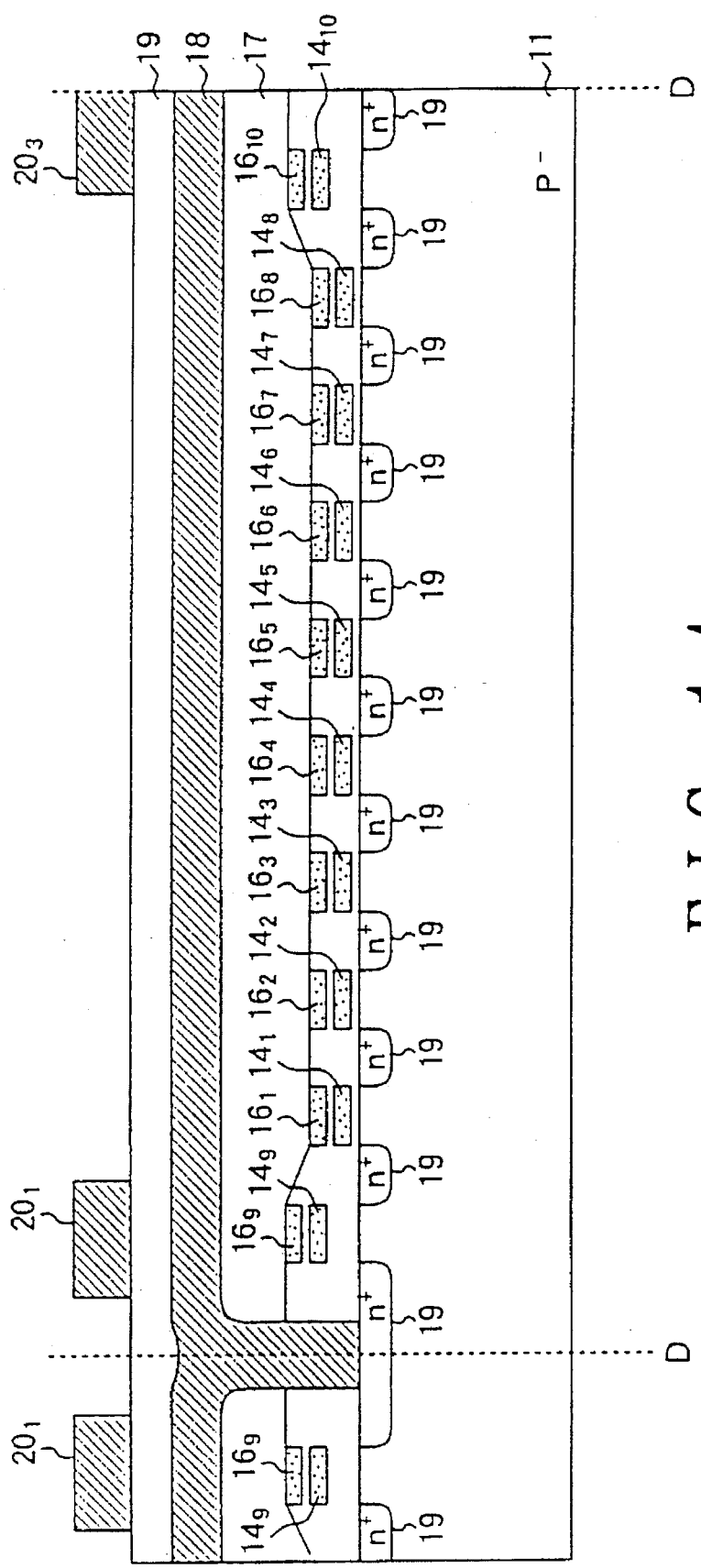
FIG. 14 is a cross-sectional view, taken along the line D–D' in FIG. 13(a)
Figure 15:
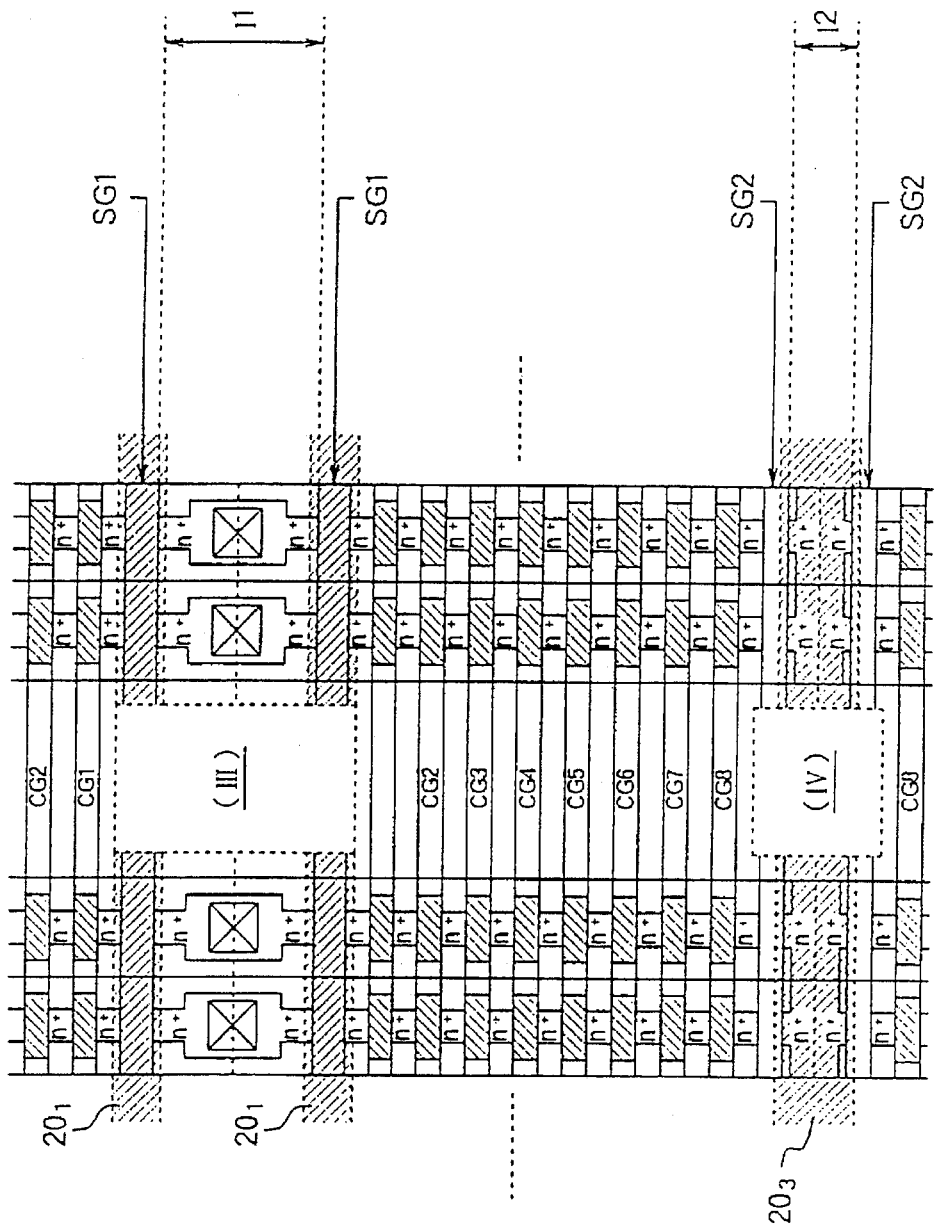
FIG. 15 is a plane view showing the construction of a plurality of the NAND cells related to the third and fourth embodiments according to the present invention.

FIG. 10 shows an example of the other embodiments. When the memory size is reduced in FIG. 7, since the element separating region 12 is also reduced, there arises the case where no space for forming additional contacts to the other wire cannot be provided between the two adjacent select gate lines 14, as shown in FIG. 8(a). In particular, in FIG. 7, the bit line contacts exist in the region 11. In this case, although the region 11 cannot be reduce excessively small, it is not necessary to provide contacts in only the region 12. Therefore, the region 12 can be formed smaller than the region 11, with the result that there often exists the case where it is impossible to form the respective contacts between the two adjacent select gates on the source line side. In this case, as shown in FIG. 10, it is possible to adopt such a method that two adjacent select gate lines are connected to each other (the two select gates are at the same potential) and only a single contact is formed in common for the two adjacent select gate lines. Here, FIG. 13(a) is a plane view showing one NAND cell of the memory cell array of when the method such that the common contact is formed only on the source side of the two adjacent select gate lines is adopted. Further, FIG. 13(b) is an equivalent circuit thereof. Further, FIG. 14 is a cross-sectional view taken along the line D–D' shown in FIG. 13(a). Further, FIG. 15 is a plane view showing the arrangement of a plurality of NAND cells in the memory cell array of when the method such that the common contact is formed only on the source side of the two adjacent select gage lines is adopted. In addition, FIG. 28 shows the conventional case where only the common contact is formed on the two adjacent select gate lines, for comparison.

Figure 28:
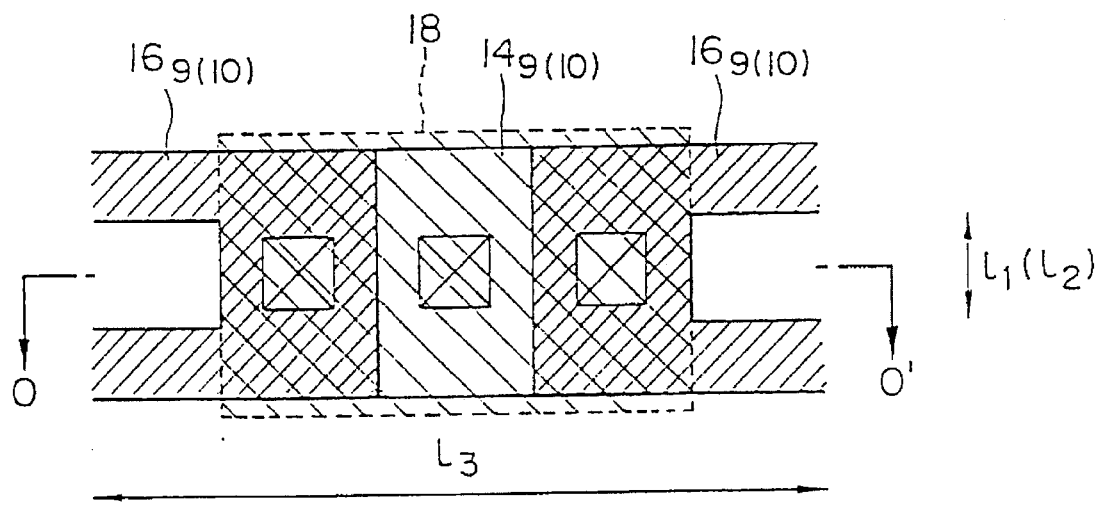
FIG. 28 is a plane view showing a modification of the select gate contact region of the conventional NAND cell array shown in FIG. 26(a)
Figure 29:
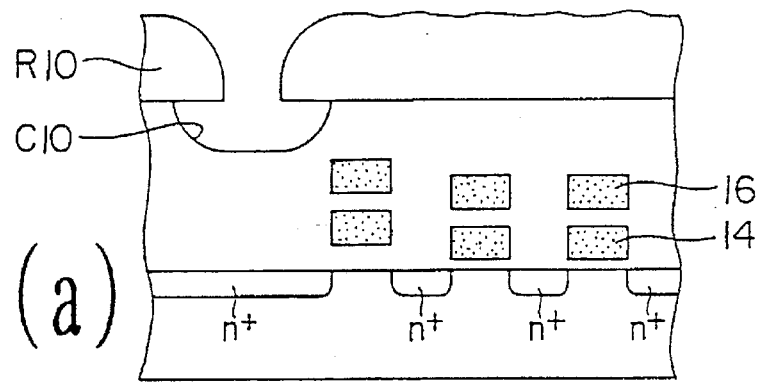
FIGS. 29(a) to 29(c) are cross-sectional views showing the manufacturing process of the select gate contact of the conventional NAND cell array.
Figure 29:
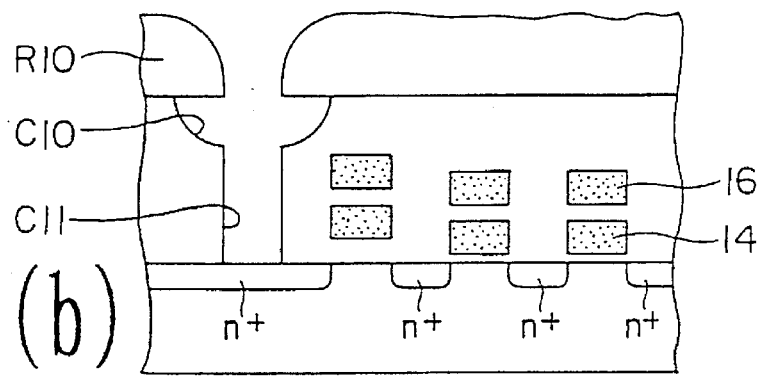
Figure 29:
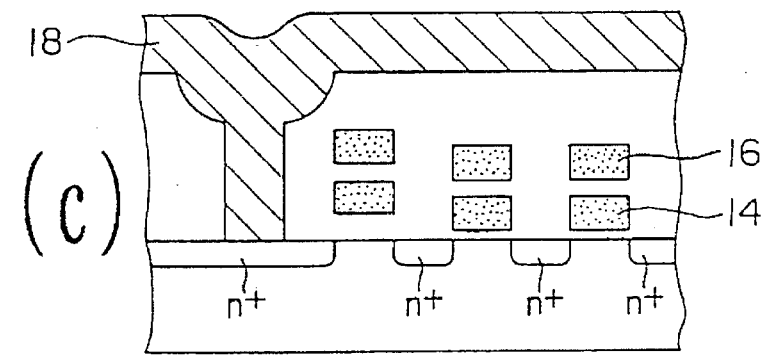

Even if only a single contact is formed in common for the two adjacent select gates in the select gate contact region (III) or (IV) as shown in FIG. 15, when the method of the present invention as shown in FIG. 10 is adopted, it is possible to reduce the width of the select gate contact region (III) or (IV) down to about ⅓ of that of the conventional method (which corresponds to that shown in FIG. 28). As a result, the chip area can be reduced markedly, as compared with the conventional method.

Further, as already explained, the method of forming different contacts to the two adjacent select gates (between the two wires), respectively is shown in FIG. 8(a) (as the invention method) and in FIG. 26(a) (as the conventional method). In the same way, the method of forming a single common contact to the two adjacent select gates is shown in FIG. 10 (as the invention method) and in FIG. 28 (as the conventional method). In the same way, in the following description, the former method corresponds to FIG. 11(a) and FIG. 18(a), and the later method corresponds to FIG. 12 and FIG. 19, respectively.

Figure 11:
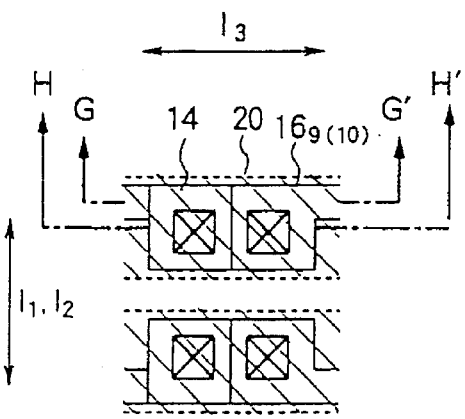
FIG. 11(a) is a plane view showing the select gate contact region (shown in FIGS. 7 and 15) related to the second and fourth embodiments according to the present invention.
FIG. 11(b) is a cross-sectional view taken along the line G–G' in FIG. 11(a)
FIG. 11(c) is a cross-sectional view taken along the line H–H' in FIG. 11(a)
Figure 11:
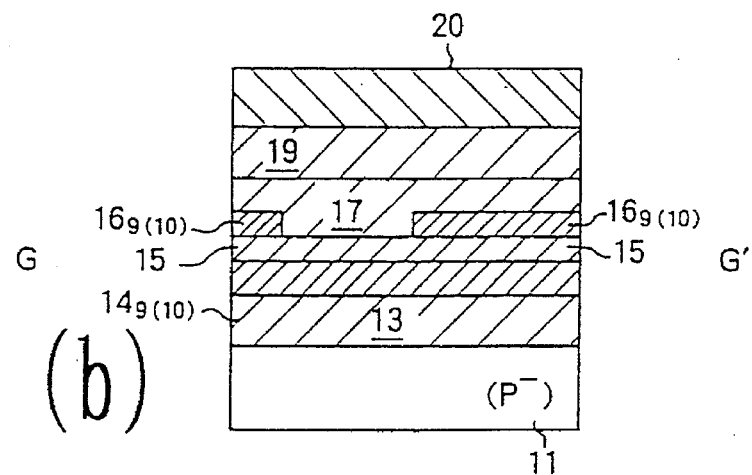
Figure 11:
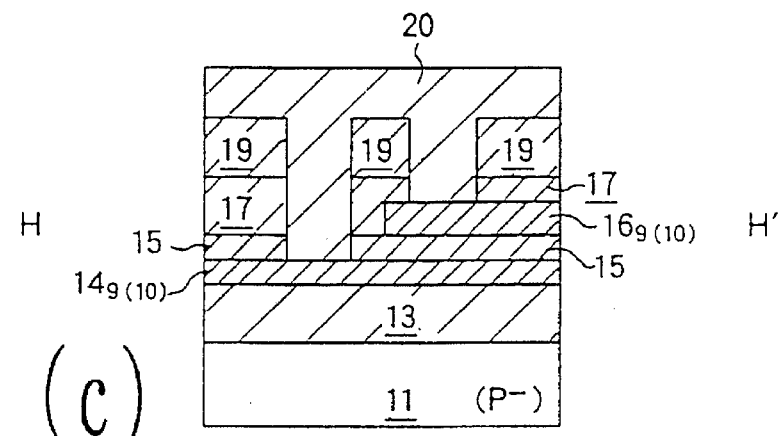
Figure 12:
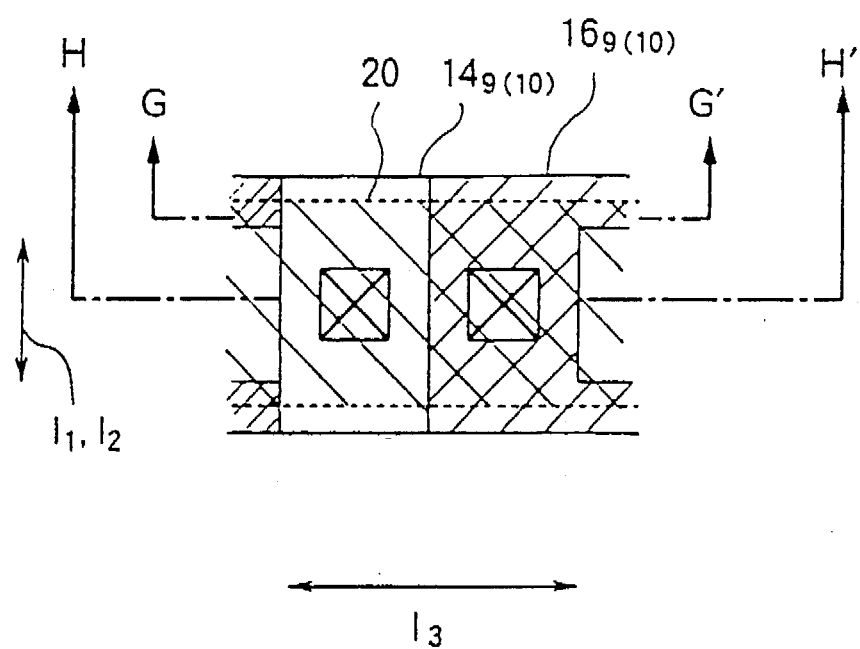
FIG. 12 is a plane view showing a modification of the select gate contact region shown in FIG. 11(a)

That is, another embodiment is shown in FIGS. 11(a) to 11(c) and FIG. 12. In this embodiment, a contact between the select gate over-adjacent wire and the subsidiary select gate line is formed on one side of both ends of the select gate over-adjacent wire in the memory cell array. Further, in the case where this method is adopted, the connection structure of the wiring in the memory cell array shown in FIGS. 11(a) is shown in more detail in FIGS. 17(a) and 17(b). As understood with reference to these drawings, in the method as shown in FIGS. 11(a) to 11(c) and FIG. 12, the select gate over-adjacent wire $16_9$ or $16_{10}$ is the same in potential as the select gate line $14_9$ or $14_{10}$. In this case, as already explained, as the wiring material of the select gate over-adjacent wire $16_9$ or $16_{10}$, a material whose resistance is lower than that of the select gate line $14_9$ or $14_{10}$ is used. Therefore, the voltage charge/discharge operation speed of the select gate over-adjacent wire $16_9$ or $16_{10}$ is higher than that of the select gate line $14_9$ or $14_{10}$. When the potential of the select gate over-adjacent wire $16_9$ or $16_{10}$ changes to a previously set potential, the potential of the select gate line $14_9$ or $14_{10}$ changes in the direction the same as the potential change direction of the select gate over-adjacent wire $16_9$ or $16_{10}$ (i.e., the potential increasing direction when charged but the potential decreasing direction when discharged), due to the capacitance coupling with the capacitance of the select gate over-adjacent wire $16_9$ or $16_{10}$. Further, after that, the potential of the select gate line $14_9$ or $14_{10}$ changes to the previously set potential perfectly by electric charge transmitted through the select gate line. As described above, when the method as shown in FIGS. 11(a) to 11(c) and FIG. 12 is adopted, it is possible to shorten the necessary potential charge/discharge time to and from the select gate line $14_9$ or $14_{10}$ by the potential change rate owing to the capacitance coupling with the select gate over-adjacent wire $16_9$ or $16_{10}$, as compared with the method in which the select gate over-adjacent wire $16_9$ or $16_{10}$ is floating as shown in FIG. 8(a) and FIG. 10. Further, since the number of contacts with the wires in the select gate contact region is only two, the width of the select gate contact region can be reduced, as compared with the three contacts formed in the select gate contact region, as shown in FIG. 26(a) and FIG. 28. As a result, it is possible to reduce the chip area markedly, as compared with the chip area formed by the conventional method. In addition, in comparison of this method with the method shown in FIG. 8(a) and FIG. 10, in this method as shown in FIGS. 11(a) to 11(c) and FIG. 12, there exists an advantage that the potential charge/discharge time can be shortened. One of these two merits is selectively adopted during chip design on the basis of the required chip operation.

FIGS. 16(a) to 16(c) and FIGS. 17(a) to 17(c) show the connection relationship among the select gate line $14_9$ or $14_{10}$, the select gate over-adjacent wire $16_9$ or $16_{10}$, and the subsidiary select gate line 20 in the select gate line input section (which corresponds to the periphery of the contact portion between the wiring layer 20 and the wiring layer 14) in and to the memory cell array. FIG. 16(a) is a plane view showing the select gate line at the select gate line input section in and to the memory cell array. FIGS. 16(b) and 16(c) and FIGS. 17(a) to 17(c) show the cross sections taken along the line I–I' shown in FIG. 16(a). Further, FIG. 16(b) is another embodiment different from the above-mentioned embodiments, in which other wires are not connected to the select gates in the memory cell array. In this case, when the resistance of the wiring material of the select gate line $14_9$ or $14_{10}$ is high, the charge/discharge time to and from the select gate is lengthened. Even in this method, the method as shown in FIG. 16(b) can be used without any problem, as far as a short entire operation time including the charge/discharge to and from the select gate is not required for some reason and other (e.g., for the reason other than the charge/discharge time to and from the select gate) or when the resistance of the wiring material of the select gate line $14_9$ or $14_{10}$ can be reduced so that the charge/discharge to and from the select gates is not lengthened. Further, when the method as shown in FIG. 16(b) is used, since the select gate contact region is not necessary in the memory cell array, the area of the memory cell array can be reduced smaller than that of the other embodiments, so that there exists such an advantage that the chip area can be minimized in the above-mentioned embodiments.

Further, as already explained and as well understood by FIG. 27, in the conventional method, in order to reduce the high resistance select gate line $14_{9(10)}$, the interlayer insulating layer 15 and the select gate over-adjacent wire $16_{9(10)}$ on the high resistance select gate line $14_{9(10)}$ are partially removed; the legs 18a and 19b of the bit line 18 are connected to the select gate over-adjacent wire $16_{9(10)}$ and the select gate line $14_{9(10)}$; and the high resistance select gate line $14_{9(10)}$ is bypassed to the low resistance select gate over-adjacent wire $16_{9(10)}$. During selection, a high voltage is applied to the select gate line $14_{9(10)}$. Therefore, when the applied high voltage is transmitted to the select gate over-adjacent wire $16_{9(10)}$, since the wire $16_{9(10)}$ is charged up, the device operation may be subjected to a harmful influence. Further, the case where the select gate over-adjacent wire $16_{9(10)}$ is charged up by an external charge can be considered.

Conventionally, in order to reduce the resistance of the select gate line $14_{9(10)}$, the interlayer insulating layer 15 and the select gate over-adjacent wire $16_{9(10)}$ over the high resistance select gate line $14_{9(10)}$ are partially removed; the wiring layer 18a or 18b the same as the bit line is connected to the select gate over-adjacent wire $16_{9(10)}$ and the select gate line $14_{9(10)}$; and the high resistance select gate line $14_{9(10)}$ is bypassed to the low resistance select gate over-adjacent wire $16_{9(10)}$. During selection, a high voltage is applied to the select gate line $14_{9(10)}$. Therefore, this high voltage exerts an influence upon the select gate over-adjacent wire $16_{9(10)}$ to charge up the wire 16, so that the device operation may deteriorate. Further, the case where the select gate over-adjacent wires $16_{9(10)}$ is charged up by an external charge may be considered.

Figure 17:
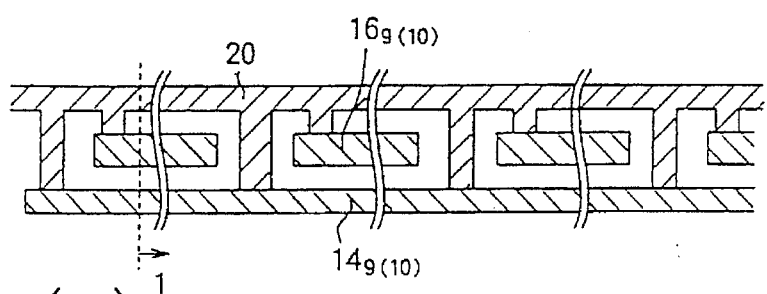
FIG. 17(a) is a cross-sectional view showing the connection of the select gate line, the select gate over-adjacent wire, and the subsidiary select gate line at the select gate line input section to and in the memory cell array, which is related to the wiring related to the second embodiment according to the present invention.
FIG. 17(b) is a cross-sectional view showing the wiring related to the second embodiment according to the present invention.
FIG. 17(c) is a cross-sectional view showing the wiring related to the conventional example.
Figure 17:
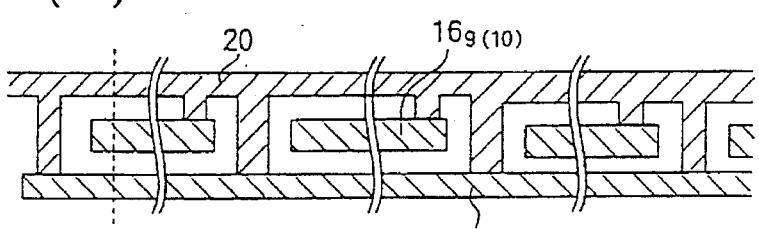
Figure 17:
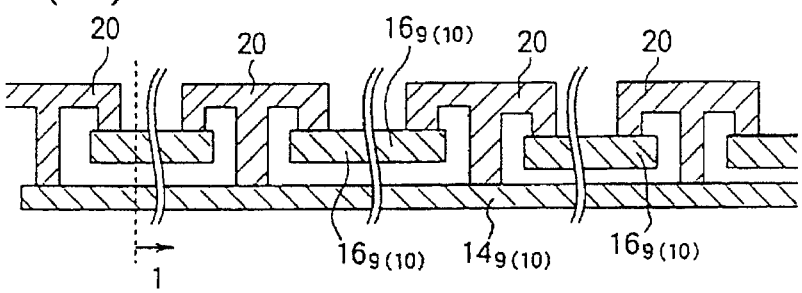

Further, the respective embodiments shown in FIGS. 16(a) to (c) and FIGS. 17(a) to 17(c), FIG. 16(c) corresponds to FIG. 8(a); FIGS. 17(a) and 17(b) both correspond to FIG. 11(a); FIG. 17(c) corresponds to FIG. 26(a), respectively as the cross-sectional views taken along the word line direction of the select gate line.

In these drawings, in FIG. 16(c), the select gate line $14_9$ or $14_{10}$ of high resistance is bypassed by the subsidiary select gate lines 20 of low resistance at predetermined intervals to reduce the resistance of the select gate line $14_9$ or $14_{10}$. Further, in this state, the select gate over-adjacent wire $16_9$ or $16_{10}$ is divided into predetermined lengths under the floating condition and further enclosed by the integral-formed select gate line $14_9$ or $14_{10}$ and the subsidiary select gate lines 20. Therefore, in the selection operation, when a high voltage is applied to the select gate line $14_9$ or $14_{10}$, it is possible to prevent the select gate over-adjacent wire $16_9$ or $16_{10}$ from being charged up by the high voltage. In addition, the select gate over-adjacent wire $16_9$ or $16_{10}$ can be prevented from being charged up by an external influence (voltage).

On the other hand, FIGS. 17(a) and (b) show a modification shown in FIG. 16(c), in which the subsidiary select gate line 20 is connected to each select gate over-adjacent wire $16_9$ or $16_{10}$. In the example shown in FIG. 17(a), the subsidiary select gate line 20 is connected to each select gate over-adjacent wire $16_9$ or $16_{10}$ on the left side of each select gate over-adjacent wire $16_9$ or $16_{10}$, and in the example shown in FIG. 17(b), the same line 20 is connected to the same wire on the right side thereof. In these examples shown in FIGS. 17(a) and 17(b), the potential at the select gate over-adjacent wire $16_9$ or $16_{10}$ is the same as that of the select gate line $14_9$ or $14_{10}$ and the subsidiary select gate line 20, so that the select gate over-adjacent wire $16_9$ or $16_{10}$ can be prevented from being charged up. Further, FIG. 7(c) shows a conventional one only for comparison.

Figure 18:
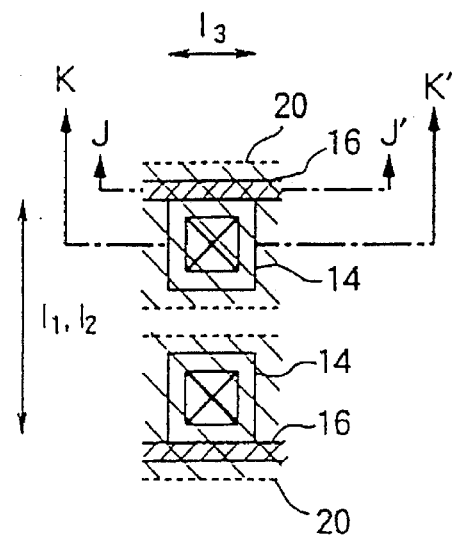
FIG. 18(a) is a plane view showing the select gate contact region (shown in FIGS. 7 and 15) related to the sixth and seventh embodiments according to the present invention.
FIG. 18(b) is a cross-sectional view taken along the line J–J' in FIG. 18(a)
FIG. 18(c) is a cross-sectional view taken along the line F–F' in FIG. 18(a)
Figure 18:
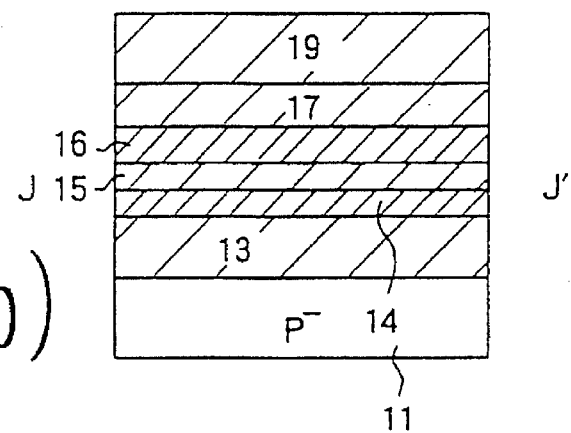
Figure 18:
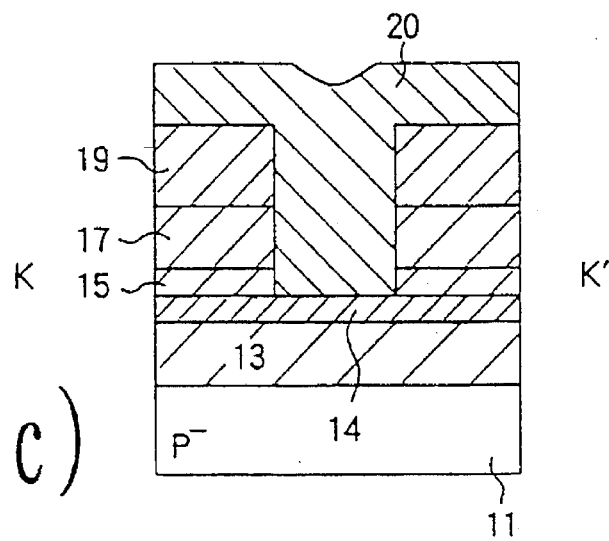
Figure 19:
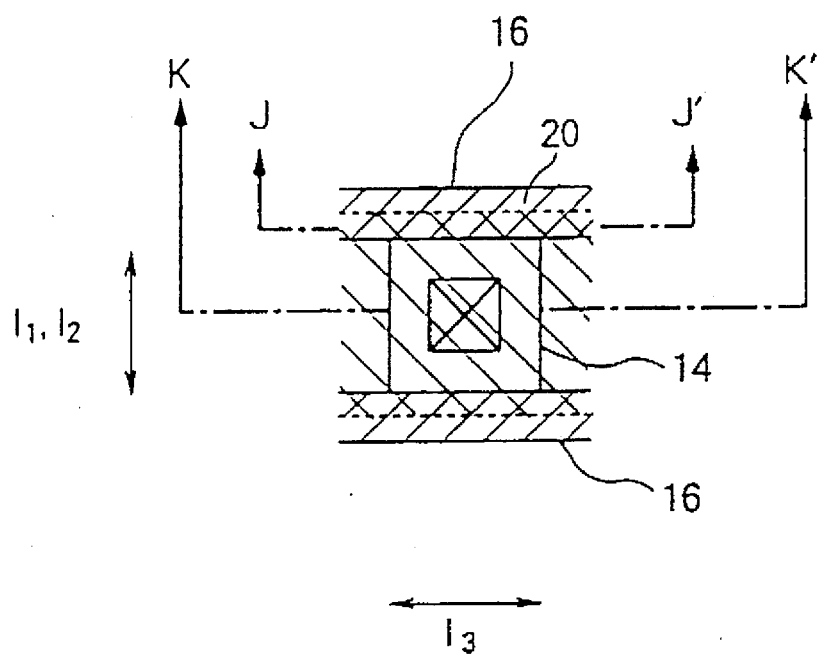
FIG. 19 is a plane view showing a modification of the select gate contact region shown in FIG. 18(a)

FIGS. 18(a) to 18(c) and FIG. 19 show still another embodiment. In this embodiment, the select gate over-adjacent wire $16_9$ or $16_{10}$ is not divided in the select gate contact region, and the select gate over-adjacent wire $16_9$ or $16_{10}$ passes through the select gate contact region. In the above-mentioned embodiment shown in FIGS. 18(a) and 19, since the number of contacts with the wires in the select gate contact region is the same as with the case shown in FIG. 8(a) and FIG. 10, it is possible to realize the chip area roughly the same as with the case shown in FIGS. 8(a) and FIG. 10, so that the chip area can be reduced markedly, as compared with the conventional memory cell array. Further, in the case as shown in FIG. 18(a) and FIG. 19, although the select gate over-adjacent wire 16 is not connected to other wires in the memory cell array, it is possible to connect the select gate over-adjacent wire to the other wire whose set potential is at the select gate line set potential at the input section of the select gate line to the memory cell array, so that this embodiment is effective in this point of view. Further, this embodiment is effective even in the case where the select gate over-adjacent wire is not connected to the other wires at the input section of the select gate line to the memory cell array and further the select gate over-adjacent wire is kept floated perfectly on both inside and outside of the memory cell array.

Figure 20:
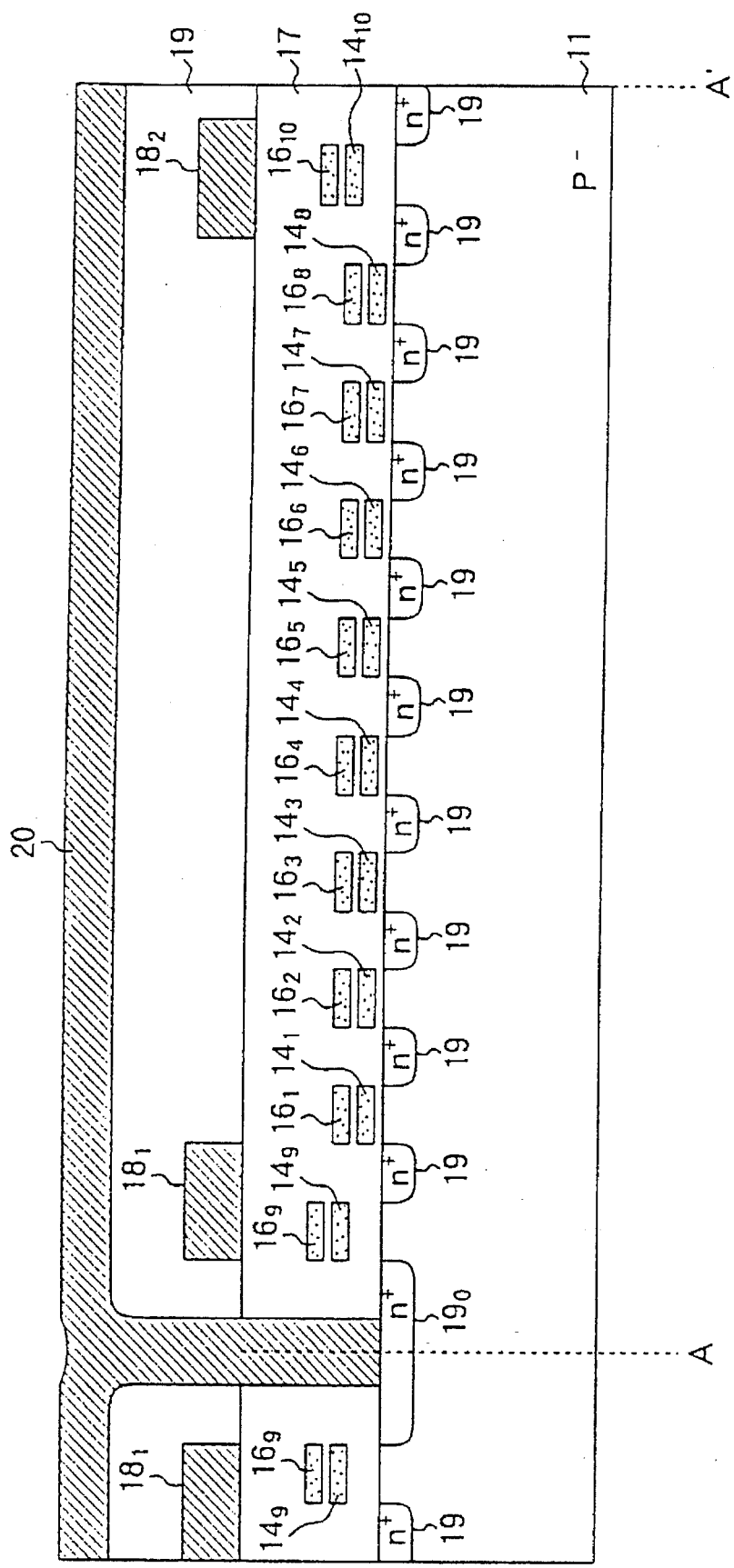
FIG. 20 is a cross-sectional view showing a modification of the NAND cell shown in FIG. 3.
Figure 21:
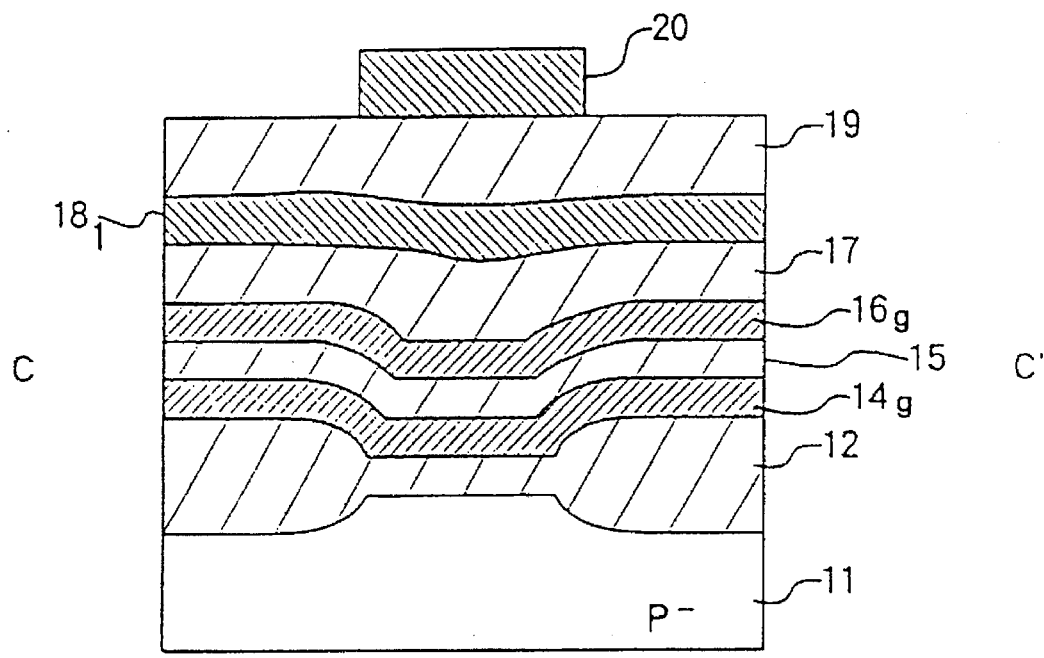
FIG. 21(a) is a cross-sectional view taken along the line C–C' shown in FIG. 2(a)
FIG. 21(b) is a cross-sectional view taken along the line B–B' shown in FIG. 2(a)
Figure 21:
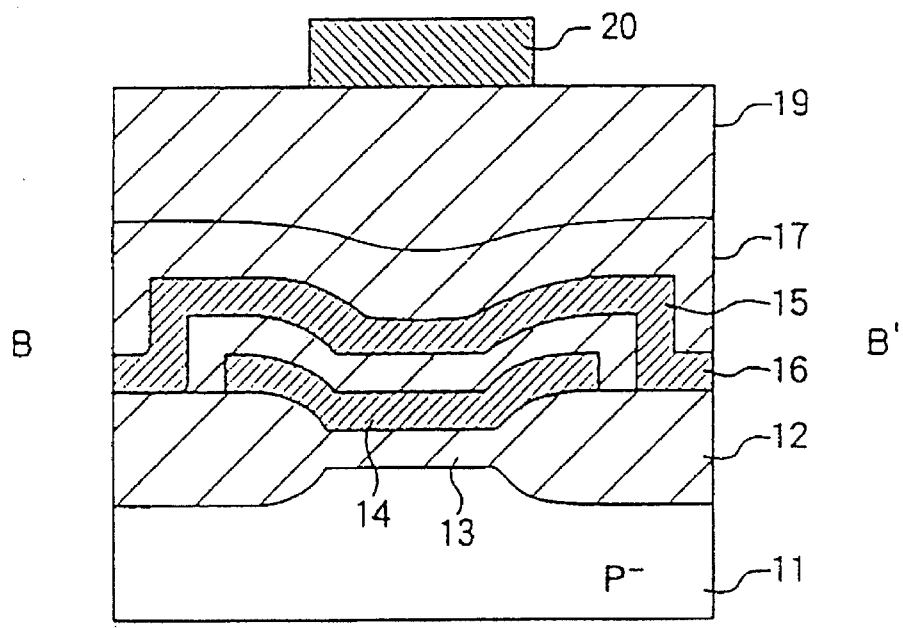

FIG. 20 is a cross-sectional view showing still another modification of the NAND cell shown in FIG. 3, in which the bit lines in the memory cell array are formed by the wiring layer 20 and further the subsidiary select gate lines are formed by the wiring layer 18. In this embodiment, the contacts between the subsidiary select gate line $18_1$ or $18_2$ and the select gate line $14_9$ or $14_{10}$ can be formed in the select gate contact region in the same way as with the other embodiments as shown in FIGS. 8(a) to 8(c) and FIG. 10; FIGS. 11(a) to 11(c) and FIG. 12; and FIGS. 18(a) to 18(c) and FIG. 19, so that it is possible to realize the present invention.

Figure 30:
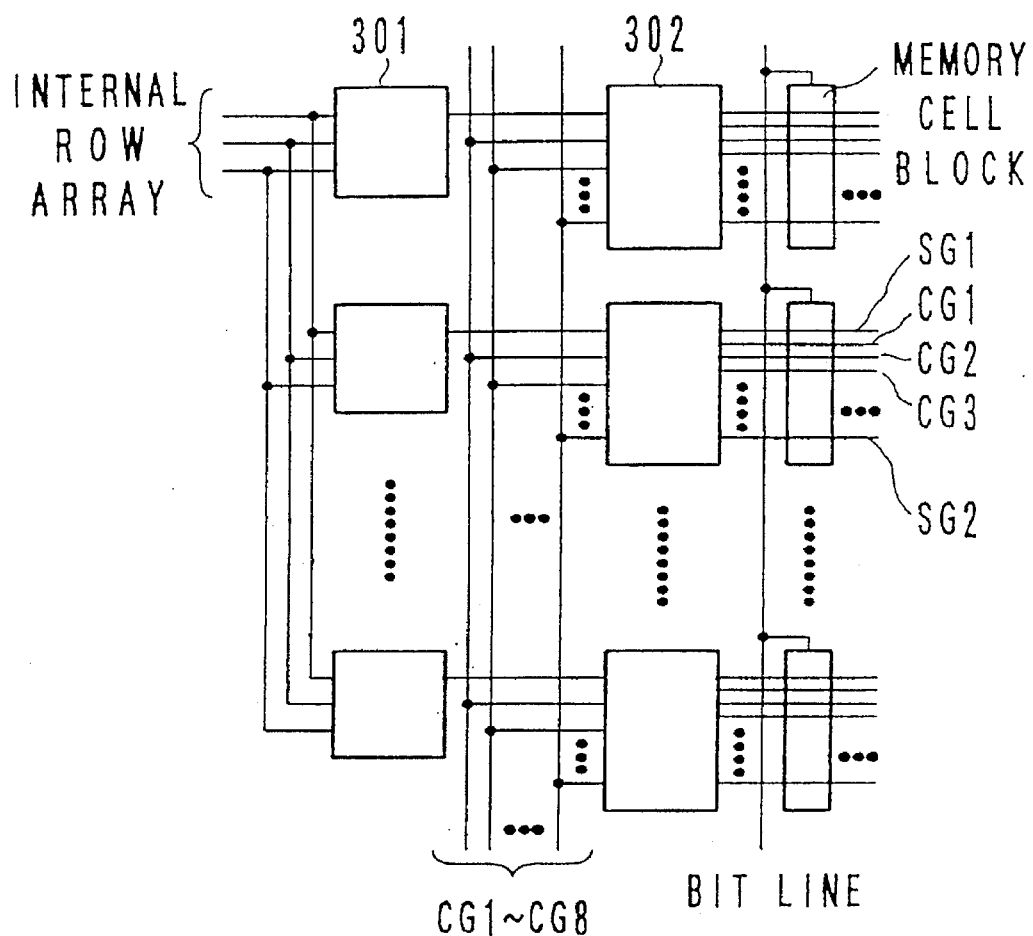
FIG. 30 is a circuit diagram showing an essential portion of a decoder system according to the present invention.

FIG. 30 shows a circuit diagram of a decode system related to the present invention. The decode system is incorporated in the decoder of the control gates CG so that the decode operation for the select gates SG can be executed. The decode system is composed of a main row decoder 301 and a subsidiary row decoder 302. The main row decoder 301 is constructed as shown in FIG. 31, and the subsidiary row decoder 302 is constructed as shown in FIG. 32.

Figure 31:
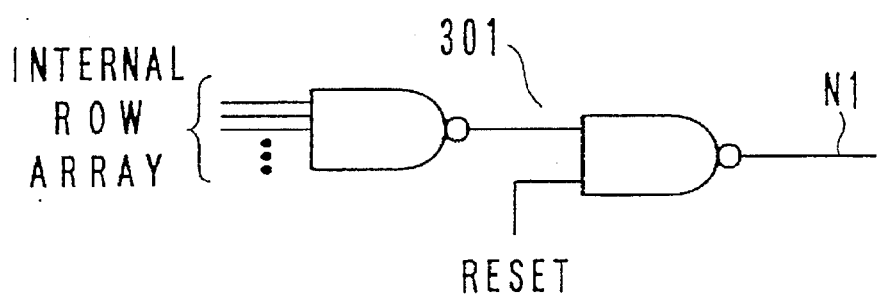
FIG. 31 is a practical circuit diagram showing a main row decoder shown in FIG. 30.

In FIG. 31, the main row decoder is a circuit for selecting one of the memory cell blocks each composed of a NAND bundle. An address inputted from the outside is converted into an internal address through an address latch circuit (not shown). On the basis of the internal row address, the main row decoder 301 outputs a signal from a node N1 to the subsidiary row decoder 302 (as shown in FIG. 32) to select one of the memory cell blocks. The potential of the input node N1 of the selected subsidiary row decoder 302 is 5 V ($V_{cc}$) and the potential of the input node N1 of the non-selected subsidiary row decoder 302 is 0 V.

Figure 32:
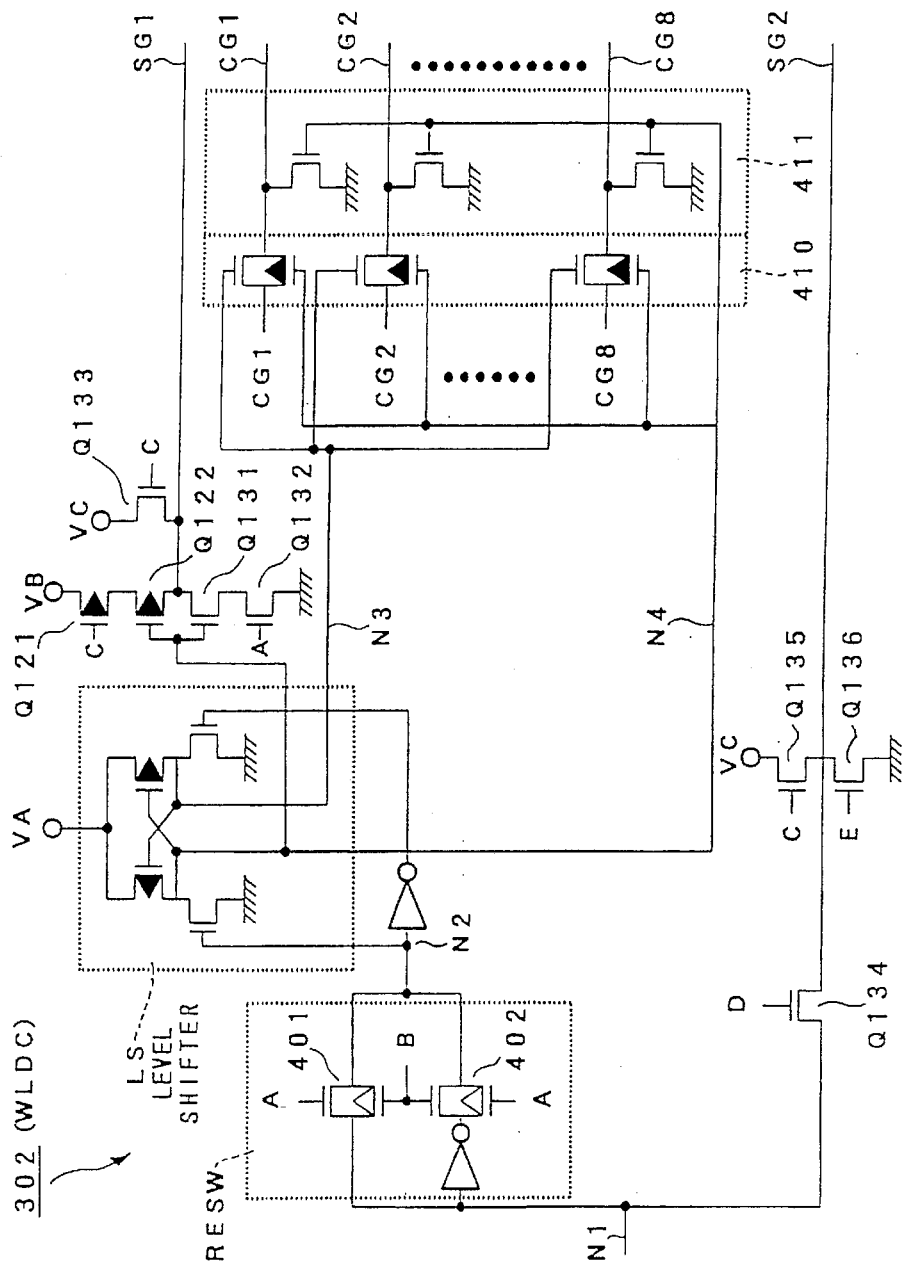
FIG. 32 is a practical circuit diagram showing a subsidiary row decoder shown in FIG. 30.
Figure 32A:
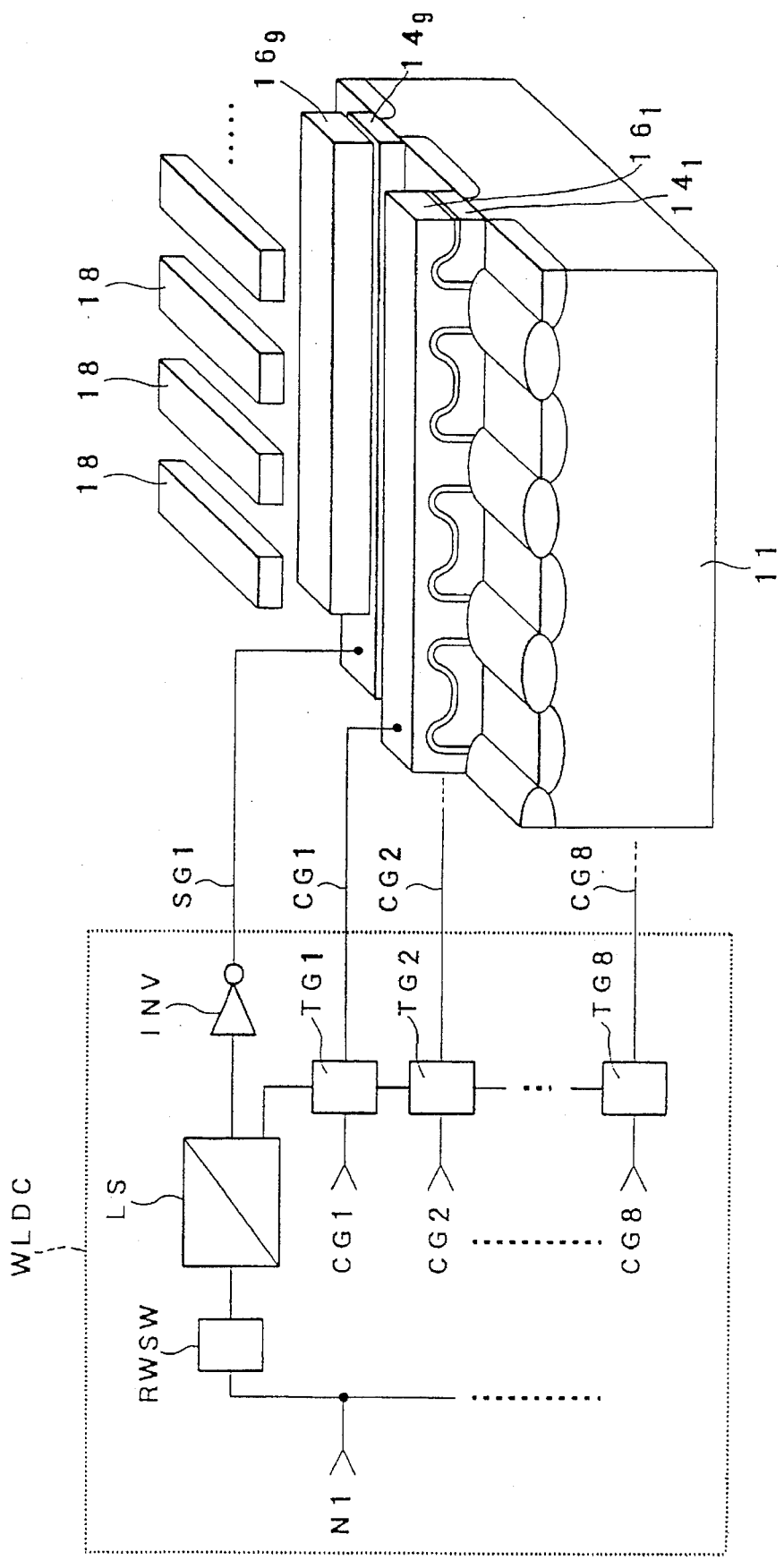
FIG. 32A is a circuit diagram showing the subsidiary row decoder, in which a part thereof is simplified.

Further, FIG. 32A shows the so-called subsidiary row decoder, whose detailed circuit construction is also shown in FIG. 32.

In FIG. 32A, a block select signal N1 is applied to a level shifter LS via a read/write switch circuit (401 and 402 in FIG. 32). The signal shifted by the level shifter LS is outputted through an inverter INV as the select gate signal SG1. The outputted select gate signal SG1 is applied to the select gate line $14_9$ formed under the adjacent connect wire $16_9$. Further, the other signal outputted by the level shifter LS is applied to the control terminals of eight transfer gates TG1 to TG8. Each of the control gate signals $CG_{i(1-8)}$ is applied to each of the transfer gates $TG_{i(1-8)}$ and further to each of the control gate lines $16_{i(1-8)}$ formed over each of the floating gates $14_{i(1-8)}$. This structure shown in FIG. 32A corresponds to that shown in FIG. 16(b). In more detail, the select signal transmission line is formed by two layers composed of a lower layer formed of the same material as that of the floating gate and an upper layer formed of the same material as that of the control gate line.

As the input signals A, B, C, D and E and the supply voltages $V_A$, $V_B$, and $V_C$ of the subsidiary row decoder 302 as shown in FIG. 32, various potentials as listed in Table 1 below are supplied in the read mode, write mode and erase mode, respectively. In Table 1, $V_{cc}$ is 5 V (in the ordinary supply voltage), for instance; $V_{pp}$ is a high writing and erasing voltage of 20 V, for instance; $V_m$ is an intermediate potential of 10 V, for instance; and GND is 0 V.

TABLE 1

|  | READ | WRITE | ERASE |
|---|---|---|---|
| SIGNAL A | $V_{cc}$ | $V_{cc}$ | GND |
| SIGNAL B | GND | GND | $V_{cc}$ |
| SIGNAL C | GND | GND | $V_{pp}$ |
| SIGNAL D | $V_{cc}$ | GND | GND |
| SIGNAL E | GND | $V_{cc}$ | GND |
| VOLTAGE $V_A$ | $V_{cc}$ | $V_{pp}$ | $V_{pp}$ |
| VOLTAGE $V_B$ | $V_{cc}$ | $V_{m}$ | $V_{cc}$ |
| VOLTAGE $V_c$ | $V_{cc}$ | $V_{cc}$ | $V_{pp}$ |

Various embodiments have been explained hereinabove. Without being limited only thereto, however, the various modifications can be made without departing from the spirit or the scope of the present invention. For instance, in the above-mentioned embodiments, although the memory cell array has been explained by taking the case of the NAND cell type EEPROM by way of example, even in NOR type EEPROM or other semiconductor devices, when the gist of the present invention is applied to the region in which a plurality of laminated wiring layers exist and further the wire formed in the lowermost layer of a plurality of wiring layers is connected to the other wire, since the contact region width can be reduced, it is possible to reduce the chip area.

As described above, in the non-volatile semiconductor memory device according to the present invention, it is possible to reduce the number of contacts in the region (at which the select gate wire is connected to the other wire) in the memory cell array, and thereby to reduce the area of the memory cell array, thus realizing a small chip area and a low-cost EEPROM, for instance, as compared with the conventional ones.

What is claimed is:

1. A non-volatile semiconductor memory device having a memory cell array formed by arranging a plurality of non-volatile reloadable semiconductor memory cells and select gate elements on a semiconductor substrate via a gate insulating film, each memory cell being formed by interposing an interlayer insulating film between a charge storage layer and a control gate line, which comprises:

a plurality of select gate lines formed by a wiring layer the same as the charge storage layer of the memory cells, as gate electrodes of the select gate elements; and select gate over-adjacent connect lines formed by a wiring layer the same as the control gate lines of the memory cells and located over the select gate lines via an insulating film, the select gate over-adjacent lines being kept floated without contacting with any other wires and potential nodes.

2. The non-volatile semiconductor memory device of claim 1, wherein a plurality of the memory cells are connected in series so as to form a memory cell bundle, and the select gate element is connected in series with one end of the memory cell bundle.

3. The non-volatile semiconductor memory device of claim 2, wherein a plurality of the memory cell bundles and a plurality of the select gate elements each connected to each of the memory cell bundles are arranged in a direction, respectively; the select gate lines of the respective select gate elements are connected in sequence so as to form a common select gate line; and further the select gate over-adjacent connect wires are connected to each other as a common select gate over-adjacent connect line.

4. The non-volatile semiconductor memory device of claim 3, which further comprises subsidiary select gate lines whose resistance is lower than that of the common select gate lines; and each of the subsidiary select gate lines and each of the common select gate lines are connected to each other at each predetermined position in such a way that each common select gate line is bypassed through each subsidiary select gate line to reduce virtual resistance of each common select gate line.

5. The non-volatile semiconductor memory device of claim 4, wherein the subsidiary select gate line is formed so as to face the common select gate line; the common select gate over-adjacent connect line is formed between the common select gate line and the subsidiary select gate line; the common select gate over-adjacent connect line is separated at predetermined intervals in a predetermined length; and the common select gate line and the subsidiary select gate line are connected to each other at each separation position in such a way that the common select gate line and the subsidiary select gate line enclose each separated common select gate over-adjacent connect line.

6. The non-volatile semiconductor memory device of claim 5, wherein the subsidiary select gate line and each separated common select gate over-adjacent connect line are connected to each other.

7. The non-volatile semiconductor memory device of claim 6, wherein the subsidiary select gate line is separated into a plurality of separated subsidiary select gate lines in a predetermined length.

8. The non-volatile semiconductor memory device of claim 4, wherein the common select gate lines are formed on a surface of the semiconductor substrate via the gate insulating film so as to extend in a first direction; the common select gate over-adjacent connect wires are formed over the common select gate lines via an insulating film so as to extend in the first direction; and the subsidiary common select gate lines are formed over the common select gate over-adjacent connect lines via an insulating film so as to extend in the first direction.

9. The non-volatile semiconductor memory device of claim 2, wherein the other end of each of the select gate elements is connected to each of corresponding bit lines for transmitting data.

10. The non-volatile semiconductor memory device of claim 9, wherein the common select gate lines are formed on a surface of the semiconductor substrate via the gate insulating film so as to extend in a first direction; the common select gate over-adjacent connect wires are formed over the common select gate lines via an insulating film so as to extend in the first direction; and the subsidiary common select gate lines are formed over the common select gate over-adjacent connect lines via an insulating film so as to extend in the first direction.

11. The non-volatile semiconductor memory device of claim 10, wherein each of the bit lines extends in a second direction roughly perpendicular to the first direction.

12. The non-volatile semiconductor memory device of claim 11, wherein the bit lines extend in the second direction between the common select gate over-adjacent connect line and the subsidiary select gate line.

13. The non-volatile semiconductor memory device of claim 11, wherein the bit lines extend in the second direction over the subsidiary select gate line.

14. The non-volatile semiconductor memory device of claim 4, wherein a pair of the common select gate lines are formed being adjacent to each other; a pair of the select gate over-adjacent connect lines are formed being adjacent to each other; and a pair of the adjacent common select gate lines are connected in common to the single subsidiary select gate line at predetermined positions.

15. The non-volatile semiconductor memory device of claim 6, wherein the subsidiary select gate line and each of the separated select gate over-adjacent connect lines are connected to each other at an end of each of the separated select gate over-adjacent connect lines along a longitudinal direction thereof.

16. The non-volatile semiconductor memory device of claim 4, wherein the subsidiary select gate line is formed so as to face the common select gate line; the select gate over-adjacent connect line is formed between the common select gate line and the subsidiary select gate line; the common select gate line and the subsidiary select gate line are connected to each other at a predetermined length position of the select gate over-adjacent connect line, without separating the select gate over-adjacent connect line.

17. The non-volatile semiconductor memory device of claim 1, wherein a predetermined number of the memory cells form a single memory cell bundle; drains of the memory cells of each memory cell bundle are connected in common as a common drain; sources of the memory cells of each memory cell bundle are connected in common as a common source; and each of the common drains are connected in series to each of the select gate elements.

18. The non-volatile semiconductor memory device of claim 17, wherein a plurality of the memory cell bundles and a plurality of the select gate elements each connected to each of the memory cell bundles are arranged in a direction, respectively; the select gate lines of the respective select gate elements are connected in sequence so as to form a common select gate line; and further the select gate over-adjacent connect wires are connected to each other as a common select gate over-adjacent connect line.

19. The non-volatile semiconductor memory device of claim 18, which further comprises subsidiary select gate lines whose resistance is lower than that of the common select gate lines; and each of the subsidiary select gate lines and each of the common select gate lines are connected to each other at each predetermined position in such a way that each common select gate line is bypassed through each subsidiary select gate line to reduce virtual resistance of each common select gate line.

20. The non-volatile semiconductor memory device of claim 17, wherein each of the common sources is connected in series to each of the other select gate elements.

21. The non-volatile semiconductor memory device of claim 20, wherein a plurality of the memory cell bundles and a plurality of the select gate elements each connected to each of the memory cell bundles are arranged in a direction, respectively; the select gate lines of the respective select gate elements are connected in sequence so as to form a common select gate line; and further the select gate over-adjacent connect wires are connected to each other as a common select gate over-adjacent connect line.

22. The non-volatile semiconductor memory device of claim 21, which further comprises subsidiary select gate lines whose resistance is lower than that of the common select gate lines; and each of the subsidiary select gate lines and each of the common select gate lines are connected to each other at each predetermined position in such a way that each common select gate line is bypassed through each subsidiary select gate line to reduce virtual resistance of each common select gate line.

23. The non-volatile semiconductor memory device of claim 3, which further comprises a subsidiary row decoder for activating a drive circuit for driving the common select gate line and the control gate lines; and in response to an input signal, the subsidiary row decoder outputs a select gate drive signal for activating the common select gate line and further control gate drive signals for activating the control gate lines, to selectively activate the memory cells.

24. The non-volatile semiconductor memory device of claim 23, wherein the select gate drive signal is applied to the common select gate line, the common select gate line and the common select gate over-adjacent connect line being arranged facing each other on upper and lower sides so as to form a double layer structure; and the control gate drive signals are applied to the control gate lines.

25. A non-volatile semiconductor memory device having a memory cell array, wherein the memory cell array is composed of a plurality of memory transistors serving as memory cells arranged into a matrix pattern and a plurality of select transistors serving as switches; each of the memory transistors and the select transistors is of double layered MOS transistor formed by laminating a first layer as a first gate layer and a second layer as a second gate layer; a memory cell bundle is formed by connecting a plurality of the memory transistors in series; each select transistor is connected to one end of each memory cell bundle; the first gate layers of a plurality of the select transistors arranged in each same row are connected in common as each select gate line; and the second gate layers of a plurality of the memory transistors arranged in each same row are connected in common as each word line.

26. The non-volatile semiconductor memory device having a memory cell array of claim 25, wherein the second gate layers of a plurality of the select transistors arranged in each same row are connected in common; a bypass line is formed roughly in parallel to each select gate line; and each select gate line is shunted by the bypass line at predetermined intervals.

27. The non-volatile semiconductor memory device having a memory cell array of claim 26, wherein each of the select gate lines is electrically connected to the bypass line to achieve a bypass.

28. A non-volatile semiconductor memory device having a memory cell array, wherein the memory cell array is composed of a plurality of memory transistors serving as memory cells arranged into a matrix pattern and a plurality of select transistors serving as switches; each of the memory transistors and the select transistors is of double layered MOS transistor formed by laminating a first layer as a first gate layer and a second layer as a second gate layer; a memory cell bundle is formed by connecting drains of a plurality of the memory transistors in common as a common drain and by connecting sources of a plurality of the memory transistors in common as a common source; each select transistor is connected to one end of the common drain of each memory cell bundle; the first gate layers of a plurality of the select transistors arranged in each same row are connected in common as each select gate line; and the second gate layers of a plurality of the memory transistors arranged in each same row are connected in common as each word line.

29. The non-volatile semiconductor memory device having a memory cell array of claim 28, wherein a plurality of the second gate layers of the select transistors arranged in each same row are connected in common; a bypass line is formed roughly in parallel to each select gate line; and each select gate line is shunted by the bypass line at predetermined intervals.

30. The non-volatile semiconductor memory device having a memory cell array of claim 29, wherein each of the select gate lines is electrically connected to the bypass line to achieve a bypass.

31. A non-volatile semiconductor memory device having a memory cell array, wherein the memory cell array is composed of a plurality of memory transistors serving as memory cells arranged into a matrix pattern and a plurality of select transistors serving as switches; each of the memory transistors and the select transistors is of double layered MOS transistor formed by laminating a first layer as a first gate layer and a second layer as a second gate layer; a memory cell bundle is formed by connecting drains of a plurality of the memory transistors in common as a common drain and by connecting sources of a plurality of the memory transistors in common as a common source; each select transistor is connected to one end of the common drain of each memory cell bundle and further each select transistor is connected to one end of the common source of each memory cell bundle; the first gate layers of a plurality of the select transistors arranged in each same row are connected in common as each select gate line; and the second gate layers of a plurality of the memory transistors arranged in each same row are connected in common as each word line.

32. The non-volatile semiconductor memory device having a memory cell array of claim 31, wherein a plurality of the second gate layers of the select transistors arranged in each same row are connected in common; a bypass line is formed roughly in parallel to each select gate line; and each select gate line is shunted by the bypass line at predetermined intervals.

33. The non-volatile semiconductor memory device having a memory cell array of claim 32, wherein each of the select gate lines is electrically connected to the bypass line to achieve a bypass.

* * * * *